(12) United States Patent
Jen et al.

(10) Patent No.: US 8,552,419 B2
(45) Date of Patent: Oct. 8, 2013

(54) CROSS-CONJUGATED POLYMERS FOR ORGANIC ELECTRONIC DEVICES AND RELATED METHODS

(75) Inventors: Kwan-Yue Jen, Kenmore, WA (US); Fei Huang, Guangzhou (CN); Hin-Lap Yip, Seattle, WA (US)

(73) Assignee: University of Washington, Seattle, WA (US)

( * ) Notice: Subject to any disclaimer, the term of this patent is extended or adjusted under 35 U.S.C. 154(b) by 0 days.

(21) Appl. No.: 13/192,961

(22) Filed: Jul. 28, 2011

(65) Prior Publication Data
US 2012/0112170 A1    May 10, 2012

Related U.S. Application Data

(63) Continuation of application No. PCT/US2010/022444, filed on Jan. 28, 2010.

(60) Provisional application No. 61/147,848, filed on Jan. 28, 2009, provisional application No. 61/248,306, filed on Oct. 2, 2009.

(51) Int. Cl.
*H01L 29/08* (2006.01)

(52) U.S. Cl.
USPC  257/40; 526/256; 257/E51.026; 257/E51.025

(58) Field of Classification Search
USPC ............ 257/40, E51.026, E51.025; 526/256
See application file for complete search history.

(56) References Cited

U.S. PATENT DOCUMENTS 3,895,944 A    7/1975  Wiedemann
5,536,588 A *  7/1996  Naito ............................ 428/690

OTHER PUBLICATIONS

Pal et al. Macromolecules, vol. 41, No. 18, 2008.*
Ciulei, S.C., and R.R. Tykwinski, "Cross-Conjugated Chromophores: Synthesis of iso-Polydiacetylenes with Donor/Acceptor Substitution," Organic Letters 2(23):3607-3610, 2000.
Li, H., and S. Valiyaveettil, "Water-Soluble Multifunctional Cross-Conjugated Poly(p-phenylenes) as Stimuli-Responsive Materials: Design, Synthesis, and Characterization," Macromolecules 40:6057-6066, 2007.
Segura, J.L., et al., "Materials for Organic Solar Cells: The C60/π-Conjugated Oligomer Approach," Chemical Society Reviews 34(1):31-47, 2005.
Zhou, E., et al., "Linking Polythiophene Chains Through Conjugated Bridges: A Way to Improve Charge Transport in Polymer Solar Cells," Macromolecular Rapid Communications 27(10):793-798, May 2006.
International Search Report and Written Opinion mailed Aug. 31, 2010, issued in corresponding International Application No. PCT/US2010/022444, filed Jan. 28, 2010, 11 pages.

* cited by examiner

*Primary Examiner* — Shane Fang
(74) *Attorney, Agent, or Firm* — Christensen O'Connor Johnson Kindness PLLC

(57) ABSTRACT

Cross-conjugated donor-acceptor polymers, methods for their preparation, devices that include polymers, and methods for the preparation and use of the devices.

25 Claims, 10 Drawing Sheets

CROSS-CONJUGATED POLYMERS FOR ORGANIC ELECTRONIC DEVICES AND RELATED METHODS

CROSS-REFERENCE TO RELATED APPLICATION

This application is a continuation of International Application No. PCT/US2010/022444, filed Jan. 28, 2010, which claims the benefit of U.S. Provisional Application No. 61/147,848, filed Jan. 28, 2009, and U.S. Provisional Application No. 61/248,306, filed Oct. 2, 2009. Each application is expressly incorporated herein by reference in its entirety.

STATEMENT OF GOVERNMENT LICENSE RIGHTS

This invention was made with Government support under Grant Number DE-FG36-08GO18024/A000 awarded by U.S. Department of Energy. The Government has certain rights in the invention.

BACKGROUND OF THE INVENTION

Polymeric solar cells (PSCs) and photodetectors have attracted considerable attention in recent years due to their unique advantages of low cost, light weight, solution based processing and potential application in flexible large area devices ((a) Yu, G.; Gao, J.; Hummelen, J. C.; Wudl, F.; Heeger, A. J., *Science* 1995, 270, 1789; (b) Brabec, C. J.; Sariciftci, N. S.; Hummelen, J. C., *Adv. Funct. Mater.* 2001, 11, 15; (c) Coakley, K. M.; McGehee, M. D., *Chem. Mater.* 2004, 16, 4533; (d) Gnes, S.; Neugebauer, H.; Sariciftci, N. S., *Chem. Rev.* 2007, 107, 1324; (e) Thompson, B. C.; Frechet, J. M. J., *Angew. Chem. Int. Ed.* 2008, 47, 58; (f) Li, Y. F.; Zou, Y. P., *Adv. Mater.* 2008, 20, 2952; (g) Yao Y.; Liang Y.; Shrotriya V.; Xiao, S. Q.; Yu, L. P.; Yang, Y., Adv. Mater. 2007, 19, 3979.)

Conventional bulk-heterojunction-type PSCs and photodetectors employ active layers that include a phase-separated blend of an organic electron donor component and an electron acceptor component. Typical donor components are conjugated polymer materials and acceptor components are fullerene derivatives. Ideally the conjugated polymer materials exhibit a high optical absorption coefficient for visible and near infrared (NIR) electromagnetic radiation to provide thin layers of the conjugated polymer materials to maximally absorb incident radiation. Significant effort has been directed to developing donor components having band gaps less than 2.0 eV for solar cell and photodetector applications ((a) Kroon, R.; Lenes, M.; Hummelen, J. C.; Blom, P. W. M.; and De Boer, B., *Polym. Rev.* 2008, 48, 531; (b) Perzon, E.; Zhang, F.-L; Andersson M.; Mammo W.; Inganäs; Andersson M. R., Adv. Mater., 2007, 19, 3308). One promising donor component is poly(3-hexylthiophene) (P3HT). The power conversion efficiency (PCE) of PSCs based on blends of P3HT with [6,6]-phenyl-C61-butyric acid methyl ester (PC61BM) in a thin film has reached about 4-5% under air mass (AM) 1.5 illumination. An external quantum efficiency (EQE) of 76% at 550 nm has been demonstrated from the same blend as a photodetector ((a) Li, G.; Shrotriya, V.; Huang, J. S.; Yao, Y.; Moriarty, T.; Emery, K.; Yang, Y., *Nat. Mater.* 2005, 4, 864; (b) Ma, W. L.; Yang, C. Y.; Gong, X.; Lee, K. H.; Heeger, A. J., *Adv. Funct. Mater.* 2005, 15, 1617; (c) Schilinsky, P.; Waldauf, C.; Brabec C. J., APL, 2002, 81, 3885). However, the further improvement of P3HT-based PSCs maybe limited due to the incomplete match with the solar spectrum and the large offset of the lowest unoccupied molecular orbital (LUMO) energy levels of P3HT and PC61BM. In addition, because P3HT only utilizes a portion of the solar spectrum, photons of relatively high energy (below 650 nm), P3HT lacks response in the NIR.

To optimize the absorption and band gap of the electron donors, donor-acceptor (D-A) conjugated polymers have been developed. In these polymers, absorption and band gap can be tuned by controlling the intramolecular charge transfer (ICT) from the donor components to the acceptor components. Using this strategy, several low band gap D-A conjugated polymers have been reported showing promising performances with PCE about 3-5% and with photoresponse beyond 750 nm ((a) Mëhlbacher, D.; Scharber, M.; Morana, M.; Zhu, Z.; Waller, D.; Gaudiana, R.; Brabec, C., *Adv. Mater.* 2006, 18, 2884; (b) Wang, E.; Wang, L.; Lan, L.; Luo, C.; Zhuang, W.; Peng, J.; Cao, Y., *Appl. Phys. Lett.* 2008, 92, 033307; (c) Blouin, N.; Michaud, A.; Gendron, D.; Wakim, S.; Blair E.; Neagu-Plesu, R.; Belletete M.; Durocher, G.; Tao, Y.; and Leclerc, M., *J. Am. Chem. Soc.* 2008, 130, 732; (d) Hou, J. H.; Chen, H.-Y.; Zhang, S. Q.; Li, G.; and Yang, Y., *J. Am. Chem. Soc.* 2008, 130, 16144); (e) Yao Y.; Liang Y.; Shrotriya V.; Xiao, S. Q.; Yu, L. P.; Yang, Y., *Adv. Mater.* 2007, 19, 3979; (f) Perzon, E.; Zhang, F.-L; Andersson M.; Mammo W.; Inganäs; Andersson M. R., *Adv. Mater.*, 2007, 19, 3308).

Conventional D-A conjugated polymers have a linear structure with a main chain that includes alternating electron-rich donor segments (D) and electron-deficient acceptor segments (A), represent by the formula (I):

(I)

Device performance of these linear D-A conjugated polymers is highly dependent on their molecular weight, their post-treatments, and the structural regioregularity of the polymers, all of which increases the complexity for preparing these materials and making devices that include these materials. Furthermore, the alternating donor-acceptor structure has been suggested to be responsible for reduced hole mobility because the presence of the electron-deficient moieties on the polymer main chain act as the hole trap and thereby hinder hole conduction along the polymer main chain ((a) Ma, W. L.; Kim, J. Y.; Lee, K.; Heeger, A. J., *Macromol. Rapid Commun.* 2007, 28, 1776; (b) Ballantyne, A. M.; Chen, L.; Dane, J.; Hammant, T.; Braun, F. M.; Heeney, M.; Duffy, W.; McCulloch, I.; Bradley, D. D. C.; Nelson, J., *Adv. Funct. Mater.* 2008, 18, 2373; (c) Peet, J.; Kim, J. Y.; Coates, N. E.; Ma, W. L.; Moses, D.; Heeger, A. J.; Bazan, G. C., *Nat. Mater.* 2007, 6, 497; (d) Kim, Y. K.; Cook, S.; Tuladhar, S. M.; Choulis, S. A.; Nelson, J.; Durrant, J. R.; Bradley, D. D. C.; Giles, M.; Mcculloch, I.; Ha, C.-S.; Ree, M., *Nat. Mater.* 2006, 5, 197).

Despite the advances in the development of donor-acceptor conjugated polymers for use in active layers of PSCs and photodetectors noted above, a need exists for donor-acceptor conjugated polymers having low and readily tuned band gaps and improved hole mobility. The present invention seeks to fulfill this need and provides further related advantages.

SUMMARY OF THE INVENTION

The invention relates to cross-conjugated D-A polymers, methods their preparation, devices that include the polymers, and methods for making and using the devices.

In one aspect, the invention provides cross-conjugated D-A polymers.

In one embodiment, the polymer comprises repeating units having the structure:

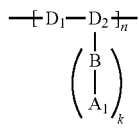

wherein $D_1$ is a donor segment, $D_2$ is a donor segment, $A_1$ is an acceptor segment, B is a π-bridge moiety that conjugates $D_2$ to $A_1$, k is 1 or 2, and n is an integer from 2 to 2000.

In one embodiment, the polymer comprises repeating units having the structure:

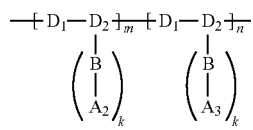

wherein $D_1$ is a donor segment, $D_2$ is a donor segment, $A_2$ is an acceptor segment, $A_3$ is an acceptor segment, B is a π-bridge moiety that conjugates $D_2$ to $A_2$ and $D_2$ to $A_3$, k is independently at each occurrence 1 or 2, m and n are integers greater than zero, and m+n is from 2 to 2000. In this embodiment, $A_2$ and $A_3$ are different.

In one embodiment, the polymer comprises repeating units having the structure:

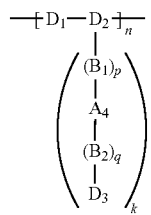

wherein $D_1$ is a donor segment, $D_2$ is a donor segment, $D_3$ is a donor segment, $A_4$ is an acceptor segment, $B_1$ is a π-bridge moiety that conjugates $D_2$ to $A_4$, $B_2$ is a π-bridge moiety that conjugates $D_3$ to $A_4$, p and q are independently 0 or 1, k is 1 or 2, and n is an integer from 2 to 200. In one embodiment, $B_1$ and $B_2$ are the same. In one embodiment, $B_1$ and $B_2$ are different.

$D_1$ at each occurrence is selected from the group consisting of substituted or unsubstituted triphenylamine, substituted or unsubstituted fluorene, substituted or unsubstituted indenofluorene, substituted or unsubstituted cyclopentadithiophene, substituted or unsubstituted 2,2'-fluorenebisthiophene, substituted or unsubstituted carbazole, substituted or unsubstituted indolocarbazole, substituted or unsubstituted silafluorene, substituted or unsubstituted silolodithiophene, substituted or unsubstituted dithienopyrrole, and substituted or unsubstituted benzobisthiophene.

$D_2$ at each occurrence is selected from the group consisting of triphenylamine, N,N-diphenyl-2-thiophenamine, 9-phenylcarbazole, 9-(2'-thiophene)-carbazole, 4-phenyldithienopyrrole, 4-(2'-thiophene)-dithienopyrrole, 6,12-diphenylindolocarbazole, tetraphenylbiphenyldiamine, and tetraphenylbenzenediamine.

$A_1$, $A_2$, and $A_3$ at each occurrence are independently selected from the group consisting of malononitrile, cyano-(3-cyano-4,5,5-trimethyl-5H-furan-2-ylidene)-acetic acid ethyl ester, 2-(3-cyano-4,5,5-trimethyl-5H-furan-2-ylidene)-malononitrile, 1,3-diethyl-2-thioxo-dihydro-pyrimidine-4,6-dione, 2-ethylidene-malononitrile, 1,3-diethyl-5-ethylidene-pyrimidine-2,4,6-trione, 2-(3-cyano-5,5-dimethyl-4-propenyl-5-furan-2-ylidene)-malononitrile, 5-ethylidene-1,3-diphenyl-2-thioxo-dihydro-pyrimidine-4,6-dione, 2-(2-ethylidene-3-oxo-indan-1-ylidene)-malononitrile, 2-[1-(2,3,5,6-tetrafluoro-pyridin-4-yl)-ethylidene]malononitrile, and cyano-(3-cyano-4,5,5-trimethyl-5-furan-2-ylidene)-acetic acid ethyl ester.

B at each occurrence is selected from the group consisting of substituted or unsubstituted phenylenevinylene thienylenevinylene, substituted or unsubstituted thienylenevinylene, substituted tetraene, substituted or unsubstituted bithiophene, and substituted or unsubstituted tetrathiophene.

$D_3$ at each occurrence is selected from the group consisting of substituted or unsubstituted triphenylamine, substituted or unsubstituted N,N-diphenyl-2-thiophenamine, substituted or unsubstituted 9-phenylcarbazole, substituted or unsubstituted 9-(2'-thiophene)-carbazole, substituted or unsubstituted 4-phenyldithienopyrrole, substituted or unsubstituted 4-(2'-thiophene)-dithienopyrrole, substituted or unsubstituted benzobisthiophene, substituted or unsubstituted tetraphenylbiphenyldiamine, and substituted or unsubstituted tetraphenylbenzenediamine.

$A_4$ at each occurrence is selected from the group consisting of benzobisthiadiazole, benzobisselenadiazole, thiadiazoloquinoxaline, thienopyrazine, and benzothiadiazole.

$B_1$ and $B_2$ at each occurrence are independently selected from the group consisting of substituted or unsubstituted benzene, substituted or unsubstituted thiophene, substituted or unsubstituted fluorene, substituted or unsubstituted carbazole, and substituted or unsubstituted bithiophene.

In another aspect, the invention provides the method for making cross-conjugated D-A type polymers having one or more acceptor types.

In a further aspect, the invention provides devices that include one or more cross-conjugated polymers of the invention as the electron donor component in the active layer. Representative devices include photovoltaic devices that can be used as solar cells, solar windows, and photodetectors, and field-effect transistor devices that can be used as photodetectors. Methods for making and using the devices are also provided.

DESCRIPTION OF THE DRAWINGS

The foregoing aspects and many of the attendant advantages of this invention will become more readily appreciated as the same become better understood by reference to the following detailed description, when taken in conjunction with the accompanying drawings.

DETAILED DESCRIPTION OF THE INVENTION

Figure 1:
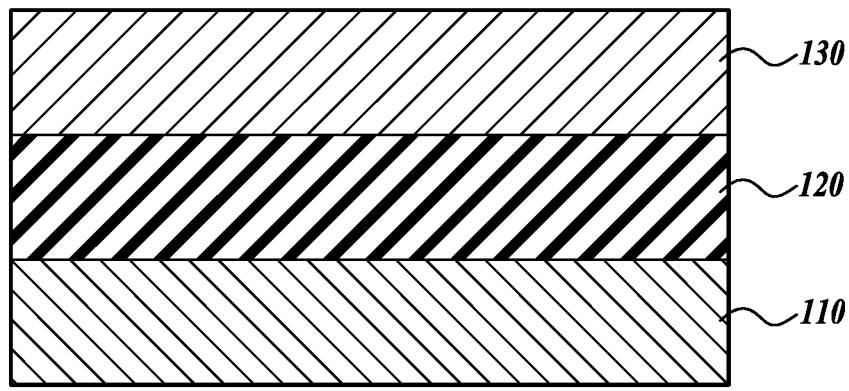
FIG. 1 is a cross-sectional view of a representative photovoltaic device incorporating one or more representative cross-conjugated polymers of the invention in the active layer.

The invention provides cross-conjugated donor-acceptor (D-A) polymers, methods for making the polymers, active layers for organic electronic devices that include the polymers, devices containing the polymers, and methods for making and using the devices.

In contrast to traditional linear D-A conjugated polymers, the cross-conjugated D-A polymers of the invention have a cross-conjugated structure. As used herein, the term "cross-conjugated polymer" refers to a polymer having a main chain comprising conjugated repeating units including one or more electron donor groups (D) and pendant groups (i.e., side chains) that include electron acceptor groups (A). The electron acceptor groups are covalently coupled to the donor groups on the main chain through π-bridge groups (B) to provide acceptor groups that are conjugated to the donor groups through their π-electrons. The cross-conjugated polymers have an electron-rich conjugated main chain comprising donor segments with cross-conjugated electron-deficient side chains comprising acceptor segments.

The polymers of the invention provide for the use of the well-established knowledge of nonlinear optical chromophores to optimize the absorption and energy level of the resulting polymers ((a) Marder, S. R.; Cheng, L.-T.; Tiemann, B. G.; Friedli, A. C.; Blanchard-Desce, M.; Perry, J. W.; and Skindhøj, J., *Science*, 1994, 263, 511; (b) Liu, S.; Haller, M. A.; Ma, H.; Dalton, L. R.; Jang, S.-H.; and Jen, A. K.-Y., *Adv. Mater.* 2003, 15, 603). The cross-conjugated structure of these polymers improve their dimensionality to enhance their isotropic charge transport ability, which is advantageous for PSC applications (Roncali, J.; Leriche, P.; and Cravino, A., *Adv. Mater.* 2007, 19, 2045). Considering the facility of chemical modification of this kind of cross-conjugated polymers, this new design provides an excellent approach for developing electron donor materials for application in organic electronic devices including PSCs and photodetectors.

The following terms are useful in understanding the invention.

As used herein, "band gap" refers to the energy difference between the highest occupied molecular orbital (HOMO) and the lowest unoccupied molecular orbital (LUMO) of a conjugated polymer.

A "donor segment" (represented by D) is an atom or group of atoms with low ionization potential relative to an acceptor segment (represented by A, defined below) such that, when the donor segment is conjugated to an acceptor segment through a π-electron bridge, electron density is transferred from the donor segment to the acceptor segment. The donor segment is an electron-rich moiety. The terms "donor" and "donor segment" are used interchangeably herein.

An "acceptor segment" (represented by A) is an atom or group of atoms with high electron affinity relative to a donor segment such that, when the acceptor segment is conjugated to a donor segment through a π-electron bridge, electron density is transferred from the acceptor segment to the donor segment. The acceptor segment is an electron deficient-rich moiety. The terms "acceptor" and "acceptor segment" are used interchangeably herein.

A "bridge" (represented by B) is an atom or group of atoms that electronically conjugates the donor segment to the acceptor segment through a π-system such that, when the acceptor segment is conjugated to the donor segment, electron density is transferred from the donor segment to the acceptor segment.

Representative donor, acceptor, and bridge groups (segments) known to those skilled in the art are described in U.S. Pat. Nos. 6,067,186; 6,090,332; 5,708,178; and 5,290,630.

In one aspect, the present invention provides cross-conjugated D-A type polymers that are useful as the electron donor component in photovoltaics and field-effect transistors.

In one embodiment, the cross-conjugated D-A polymers of the invention have a single type of acceptor attached to the polymer main chain through π-bridges, as represented by the formula (II):

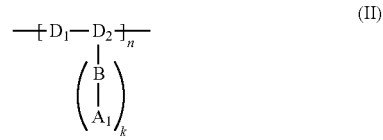

wherein $D_1$ and $D_2$ are electron-rich moieties (donor segments); $A_1$ is an electron-deficient moiety (acceptor segment); B is a π-bridge moiety that conjugates $D_2$ to $A_1$; k is 1 or 2; and n is an integer from 2 to 2000.

In one embodiment, k is 1.

In another embodiment, the cross-conjugated D-A polymers of the invention are copolymers have two types of acceptors ($A_2$ and $A_3$), each optionally having different electron-accepting strength, coupled to the polymer main chain through a π-bridge (B), as represented by the formula (III):

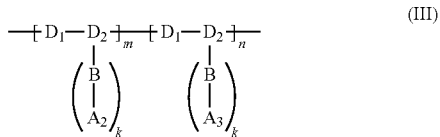

(III)

wherein $D_1$ and $D_2$ are electron-rich moieties (donor segments); $A_2$, and $A_3$ are electron-deficient moieties (acceptor segments); B is a π-bridge moiety that conjugates $D_2$ to $A_2$ and $D_2$ to $A_3$, respectively; k is 1 or 2; m and n are integers greater than zero, and m+n is from 2 to 2000.

In one embodiment, k is 1.

It will be appreciated that the polymers of the invention (i.e., polymers of formulas (II) and (III) above and formula (IV) below) are represented as having repeating groups (e.g., $-[D_1-D_2(B-A_1)_k-]$) and that the polymers further include terminal groups not shown present as a result of methods for their preparation.

Representative donor, acceptor, and π-bridge groups have structures are shown below. In these structures, the asterisk (*) identifies the point of attachment of these structures to neighboring groups in the polymer.

The donor $D_1$ at each occurrence is selected from the group consisting of substituted or unsubstituted triphenylamine, substituted or unsubstituted fluorene, substituted or unsubstituted indenofluorene, substituted or unsubstituted cyclopentadithiophene, substituted or unsubstituted 2,2'-fluorenebisthiophene, substituted or unsubstituted carbazole, substituted or unsubstituted indolocarbazole, substituted or unsubstituted silafluorene, substituted or unsubstituted silolodithiophene, substituted or unsubstituted dithienopyrrole, and substituted or unsubstituted benzobisthiophene. Representative donors include the following groups:

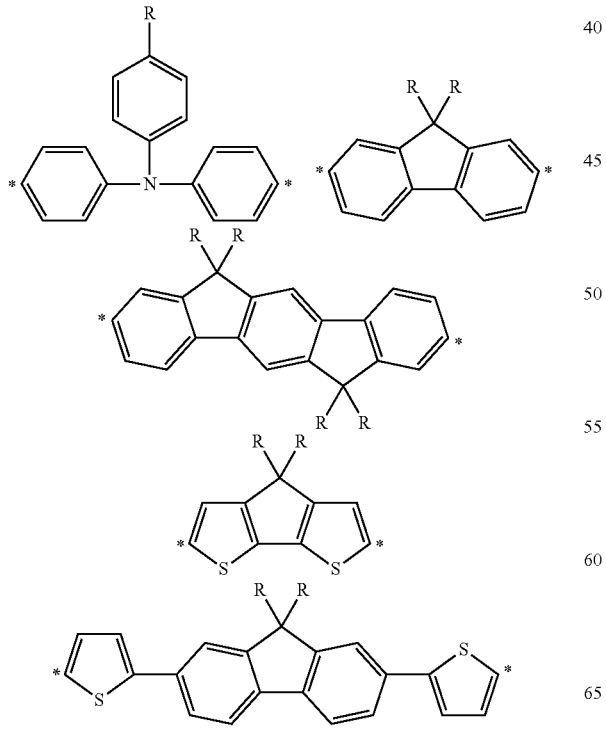

-continued

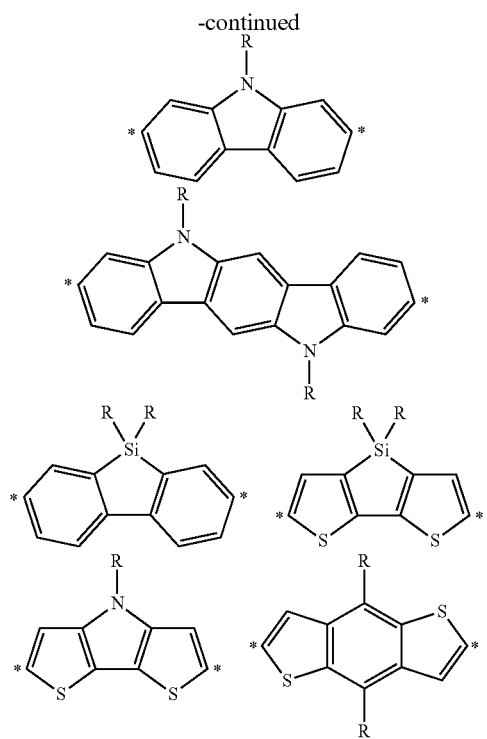

wherein R at each occurrence is independently selected from hydrogen, a C1-C20 linear or branched alkyl group, a C1-C20 linear or branched alkoxy group, a C1-C20 linear or branched dialkylamino group, a C1-C20 linear or branched alkylthio group, a C6-C26 aryl group (e.g., phenyl, naphthyl), alkyl-, alkoxy-, dialkylamino-, or alkylthio-substituted C6-C26 aryl group, a C3-C20 heteroaryl group (e.g., pyridyl, thiophenyl, furanyl) containing a N, S, or O, and an alkyl-, alkoxy-, dialkylamino-, or alkylthio-substituted C3-C20 heteroaryl containing a N, S, or O.

In one embodiment, $D_1$ is a substituted triphenylamine. A representative substituted triphenylamine has the structure:

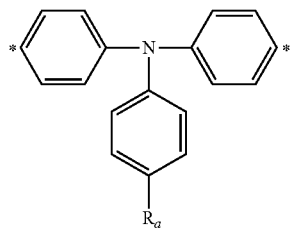

where $R_a$ is C1-C20 alkyl (e.g., n-alkyl). In one embodiment, $R_a$ is n-$C_4H_9$.

In one embodiment, $D_1$ is a substituted fluorene. A representative substituted fluorene has the structure:

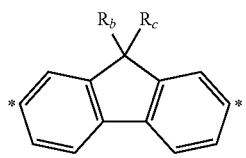

where $R_b$ and $R_c$ are independently C1-C20 alkyl (e.g., n-alkyl). In one embodiment, $R_b$ and $R_c$ are each n-$C_8H_{17}$.

In one embodiment, $D_1$ is a substituted cyclopentadithiophene. A representative substituted cyclopentadithiophene has the structure:

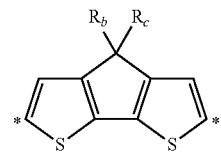

where $R_b$ and $R_c$ are independently C1-C20 alkyl (e.g., n-alkyl). In one embodiment, $R_b$ and $R_c$ are each n-$C_8H_{17}$.

In one embodiment, $D_1$ is a substituted indenofluorene. A representative substituted indenofluorene has the structure:

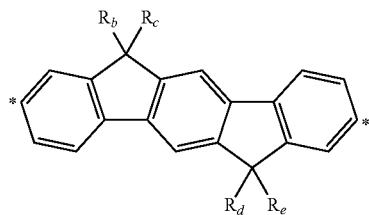

where $R_b$, $R_c$, $R_d$, and $R_e$ are independently C1-C20 alkyl (e.g., n-alkyl). In one embodiment, $R_b$, $R_c$, $R_d$, and $R_e$ are each n-$C_8H_{17}$.

In one embodiment, $D_1$ is a substituted 2,2'-fluorenebisthiophene. A representative substituted 2,2'-fluorenebisthiophene has the structure:

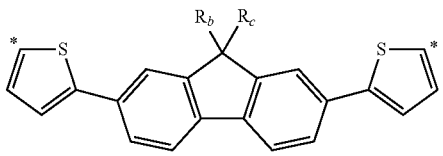

where $R_b$ and $R_c$ are independently C1-C20 alkyl (e.g., n-alkyl). In one embodiment, $R_b$ and $R_c$ are each n-$C_8H_{17}$.

In one embodiment, $D_1$ is a substituted benzobisthiophene. A representative substituted benzobisthiophene has the structure:

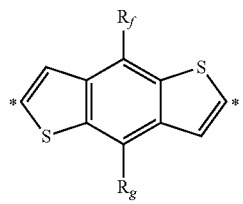

where $R_f$ and $R_g$ are independently C1-C24 alkyl (e.g., n-alkyl). In one embodiment, $R_f$ and $R_g$ are each —CH$[(CH_2)_n CH_3]_2$, where n is 6-10. In one embodiment, n is 7.

In one embodiment, $D_1$ is a substituted carbazole. A representative substituted carbazole has the structure:

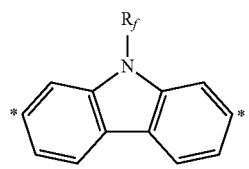

where $R_f$ is C1-C24 alkyl (e.g., n-alkyl). In one embodiment, $R_f$ is —CH$[(CH_2)_n CH_3]_2$, where n is 6-10. In one embodiment, n is 7.

The donor $D_2$ at each occurrence is selected from the group consisting of triphenylamine, N,N-diphenyl-2-thiophenamine, 9-phenylcarbazole, 9-(2'-thiophene)-carbazole, 4-phenyldithienopyrrole, 4-(2'-thiophene)-dithienopyrrole, 6,12-diphenylindolocarbazole, tetraphenylbiphenyldiamine, and tetraphenylbenzenediamine. Representative donors include the following groups:

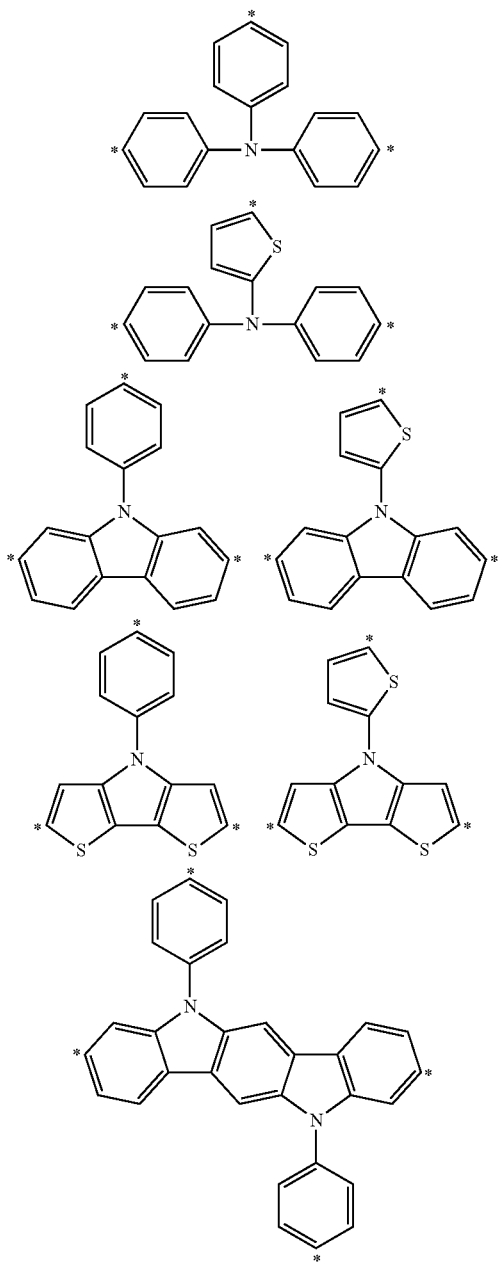

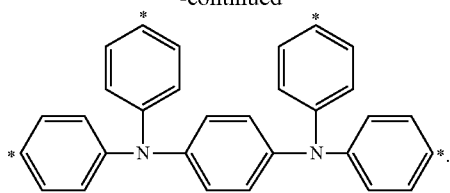

In one embodiment, $D_2$ is triphenylamine. In one embodiment, $D_2$ is tetraphenylbiphenyldiamine. In one embodiment, $D_2$ is tetraphenylbenzenediamine. In one embodiment, $D_2$ is 6,12-diphenylindolocarbazole.

Representative $D_1$-$D_2$ segments include

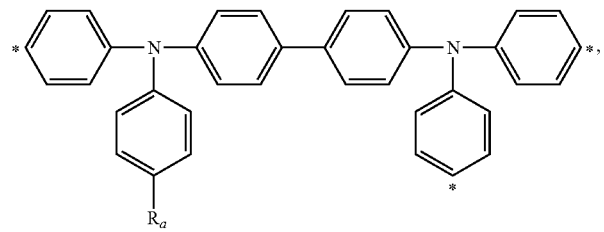

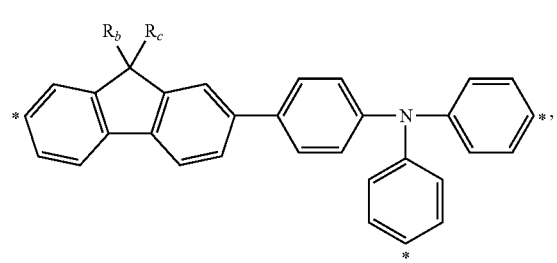

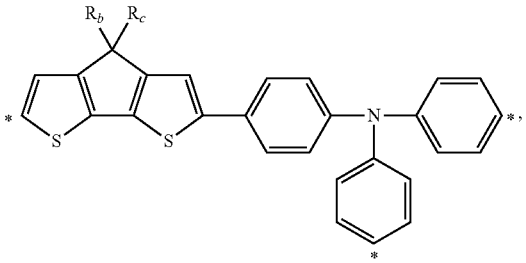

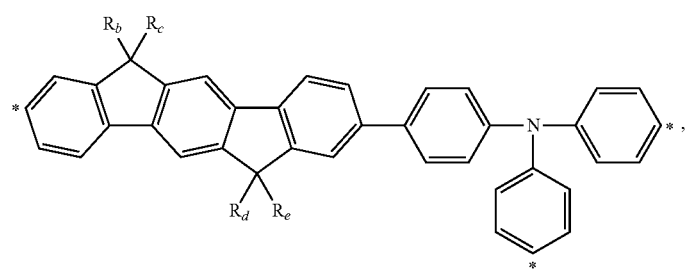

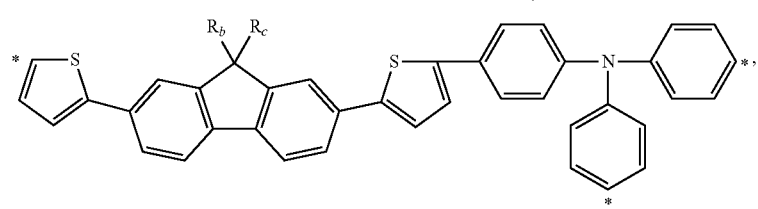

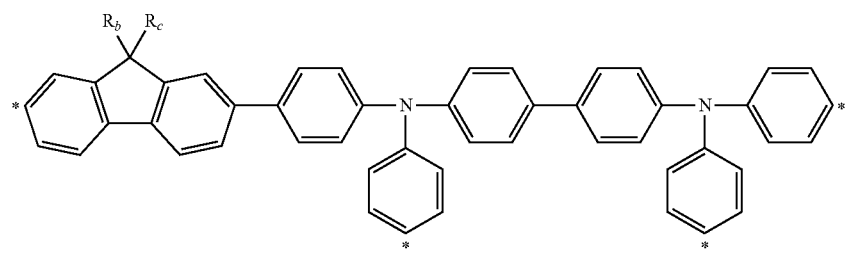

where $R_a$-$R_c$ are as described above.

As is clear from the $D_1$-$D_2$ segments shown above and the polymers shown below, the $D_1$ segment is π-conjugated to the $D_2$ segment.

The acceptors, $A_1$, $A_2$, and $A_3$, at each occurrence are independently selected from the group consisting of malononitrile, cyano-(3-cyano-4,5,5-trimethyl-5-furan-2-ylidene)-acetic acid ethyl ester, 2-(3-cyano-4,5,5-trimethyl-5H-furan-2-ylidene)-malononitrile, 1,3-diethyl-2-thioxo-dihydro-pyrimidine-4,6-dione, 2-ethylidene-malononitrile, 1,3-diethyl-5-ethylidene-pyrimidine-2,4,6-trione, 2-(3-cyano-5,5-dimethyl-4-propenyl-5-furan-2-ylidene)-malononitrile, 5-ethylidene-1,3-diphenyl-2-thioxo-dihydro-pyrimidine-4,6-dione, 2-(2-ethylidene-3-oxo-indan-1-ylidene)-malononitrile, 2-[1-(2,3,5,6-tetrafluoro-pyridin-4-yl)-ethylidene]malononitrile, and cyano-(3-cyano-4,5,5-trimethyl-5-furan-2-ylidene)-acetic acid ethyl ester. Representative donors include the following groups:

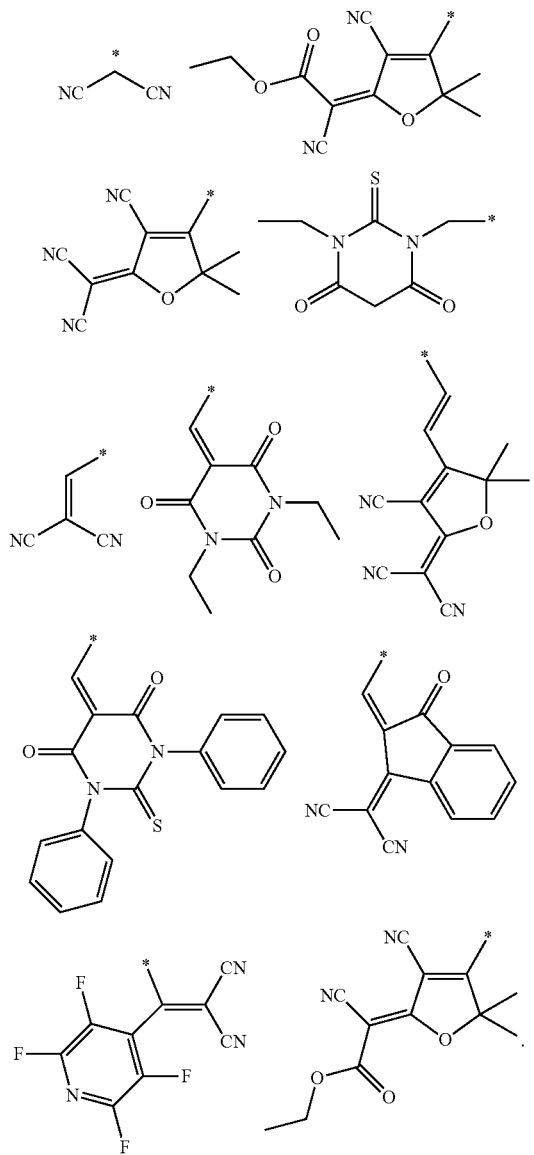

In one embodiment, $A_1$, $A_2$, and $A_3$ at each occurrence are

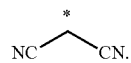

In one embodiment, $A_1$, $A_2$, and $A_3$ at each occurrence are

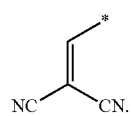

In one embodiment, $A_1$, $A_2$, and $A_3$ at each occurrence are

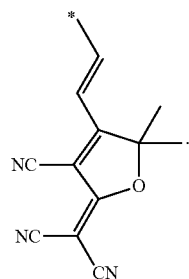 [SMILES: C/C=C/C1=C(C#N)C(=C(C#N)C#N)OC1(C)C]

In one embodiment, $A_1$, $A_2$, and $A_3$ at each occurrence are

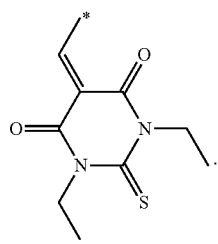

In one embodiment, $A_1$, $A_2$, and $A_3$ at each occurrence are

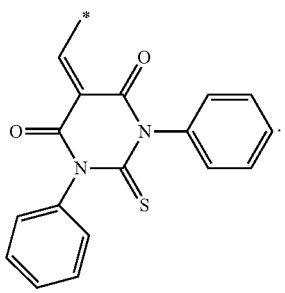 [SMILES: CC=C1C(=O)N(c2ccccc2)C(=S)N(c2ccccc2)C1=O]

The π-bridge B at each occurrence is selected from the group consisting of substituted or unsubstituted phenylenevinylene thienylenevinylene, substituted or unsubstituted thienylenevinylene, substituted tetraene, substituted or unsubstituted bithiophene, and substituted or unsubstituted tetrathiophene. Representative bridges include the following groups:

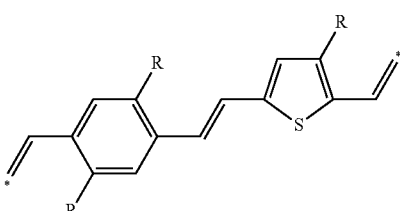

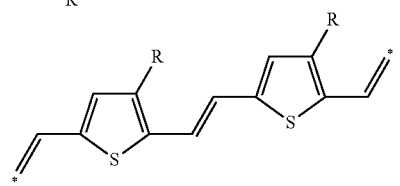

15
-continued

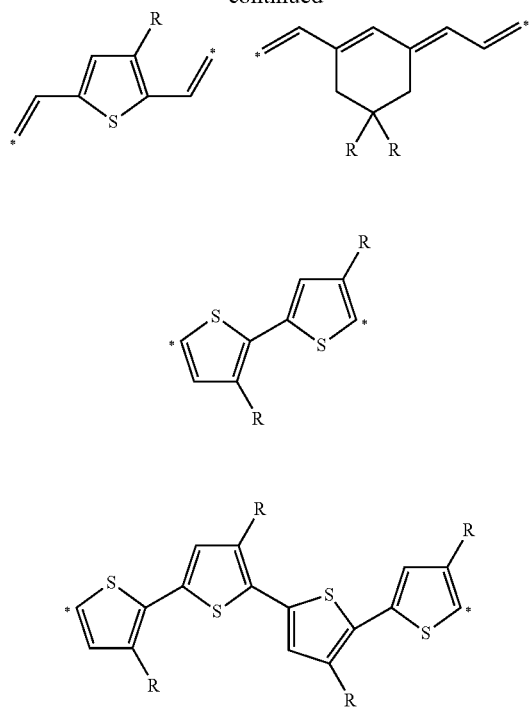

wherein R at each occurrence is independently selected from hydrogen, a C1-C20 linear or branched alkyl group, a C1-C20 linear or branched alkoxy group, a C1-C20 linear or branched dialkylamino group, and a C1-C20 linear or branched alkylthio group.

In one embodiment, the π-bridge B is thienylenevinylene. In one embodiment, the π-bridge B is thiophene.

16
Representative B-A groups include

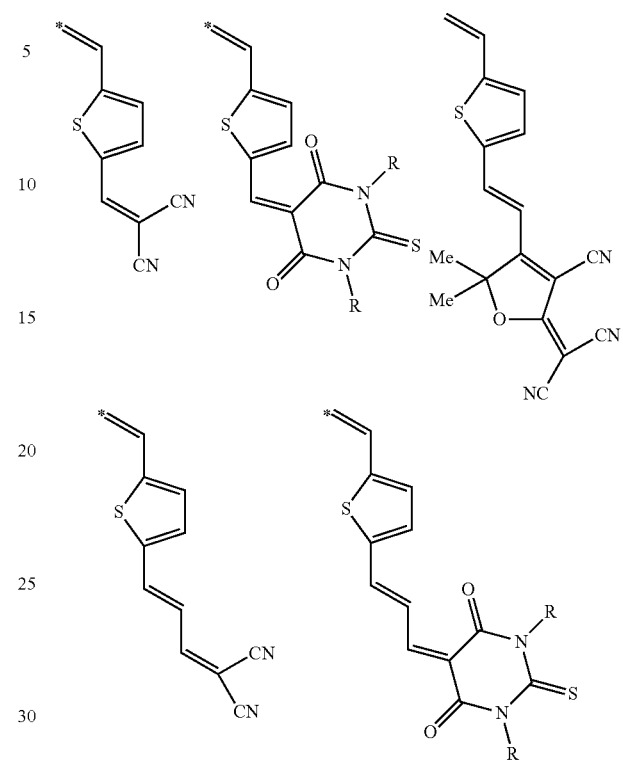

where R is ethyl or phenyl.

As is clear from the B-A segments shown above and the polymers shown below, the B segment is π-conjugated to the A segment.

The following are representative examples of cross-conjugated D-A polymers of the invention having formula (II), where k is 1.

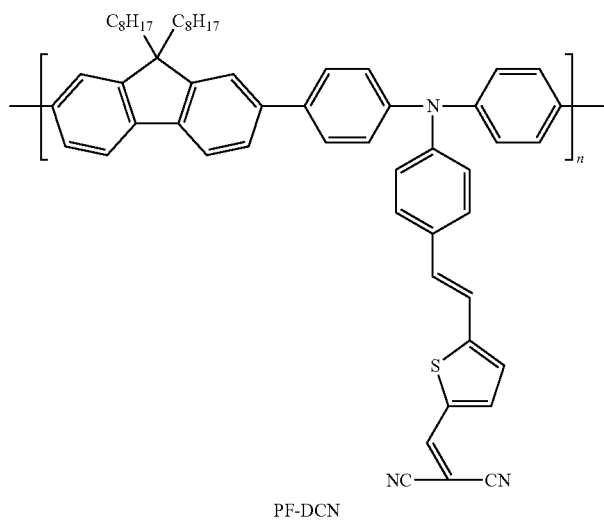

PF-DCN

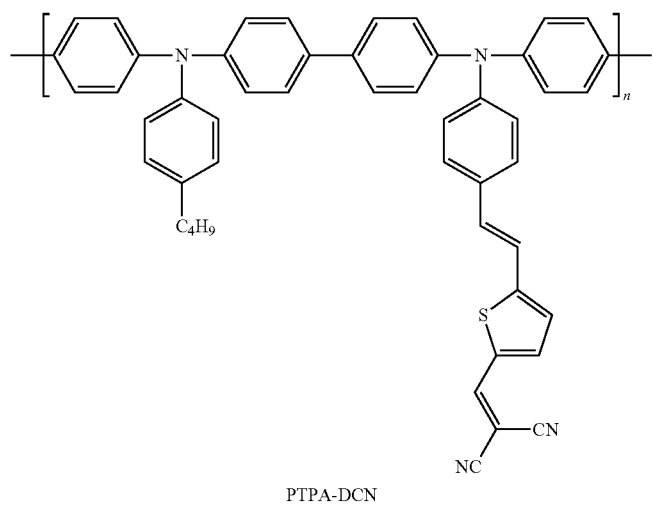
PTPA-DCN
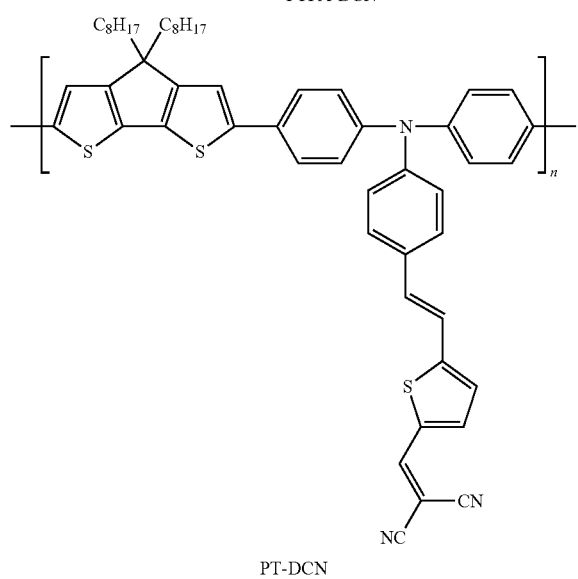
PT-DCN
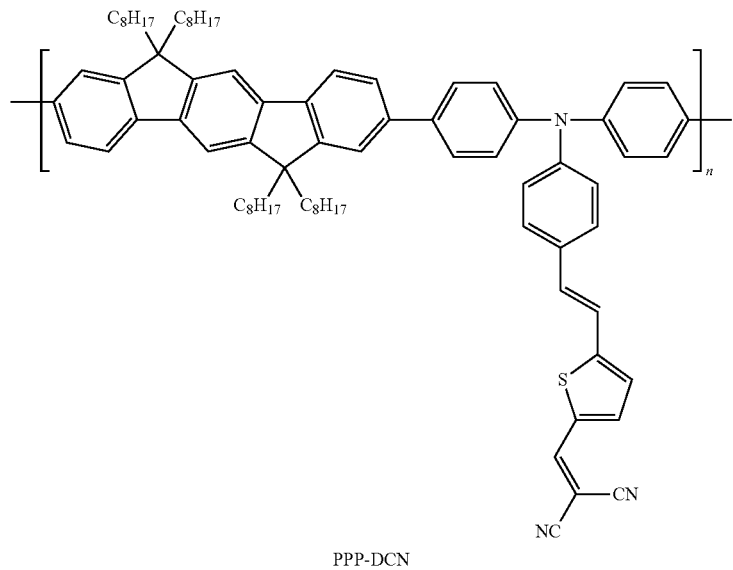
PPP-DCN

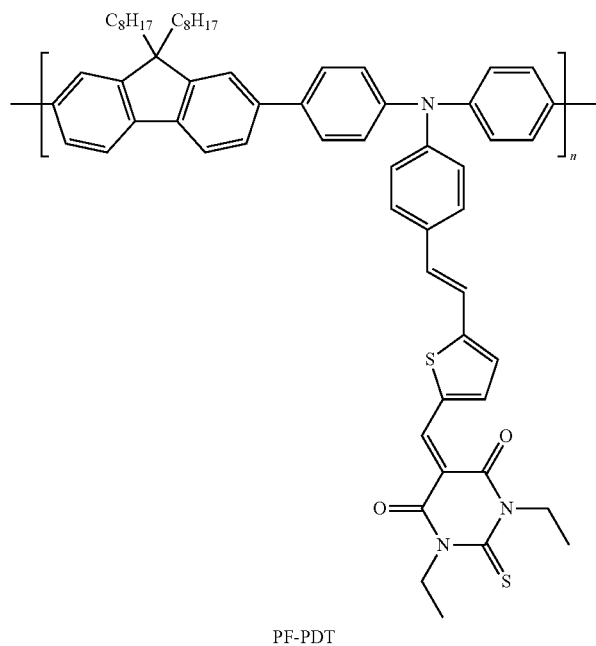
PF-PDT
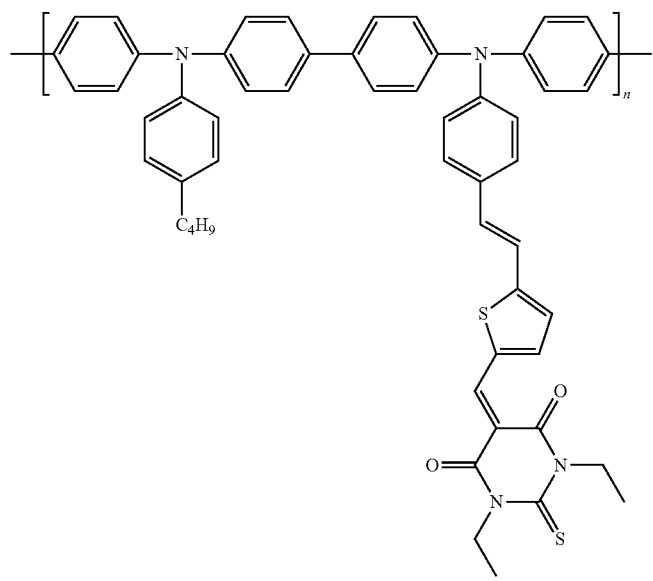
PTPA-PDT

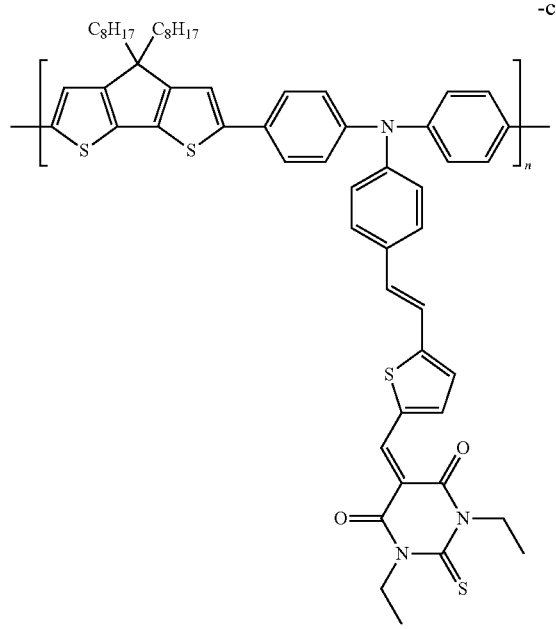
PT-PDT
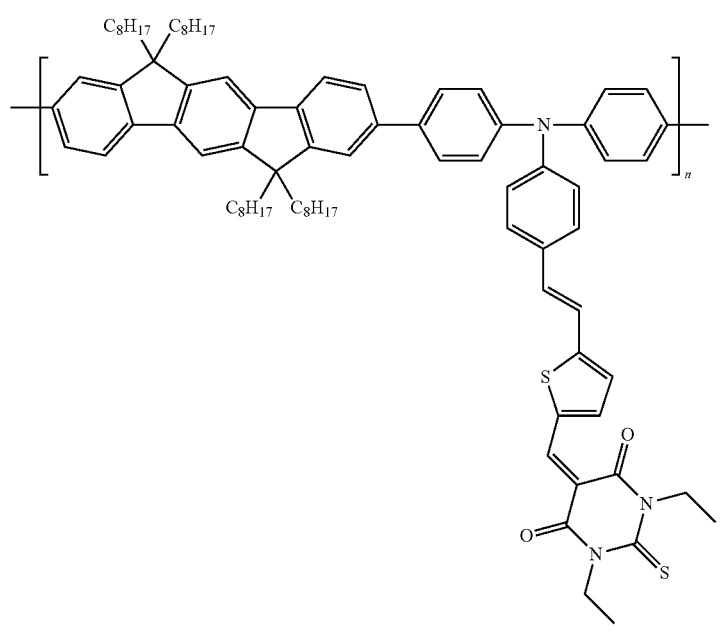
PPP-PDT

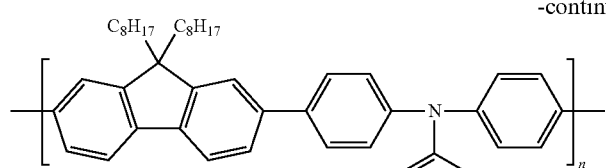
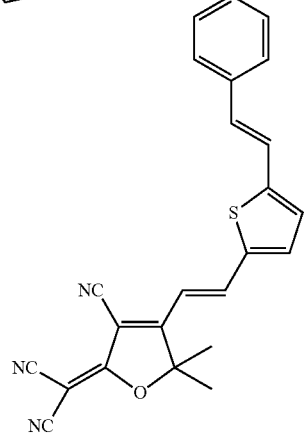
PF-TCF
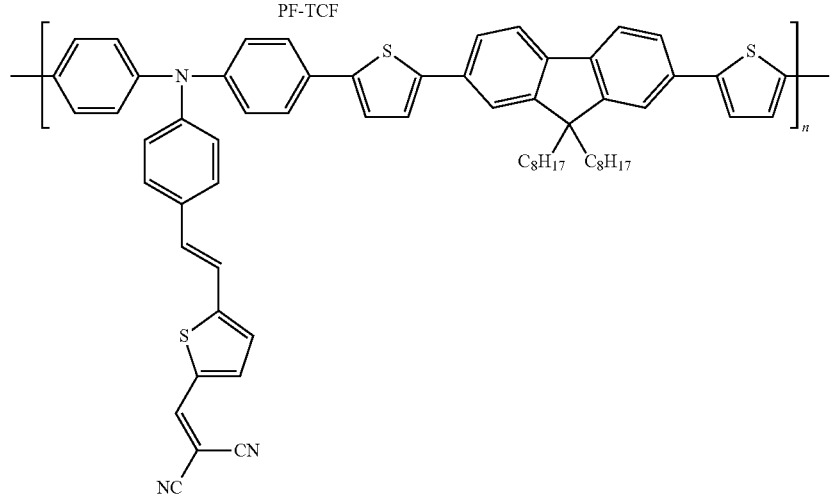
PFT-DCN
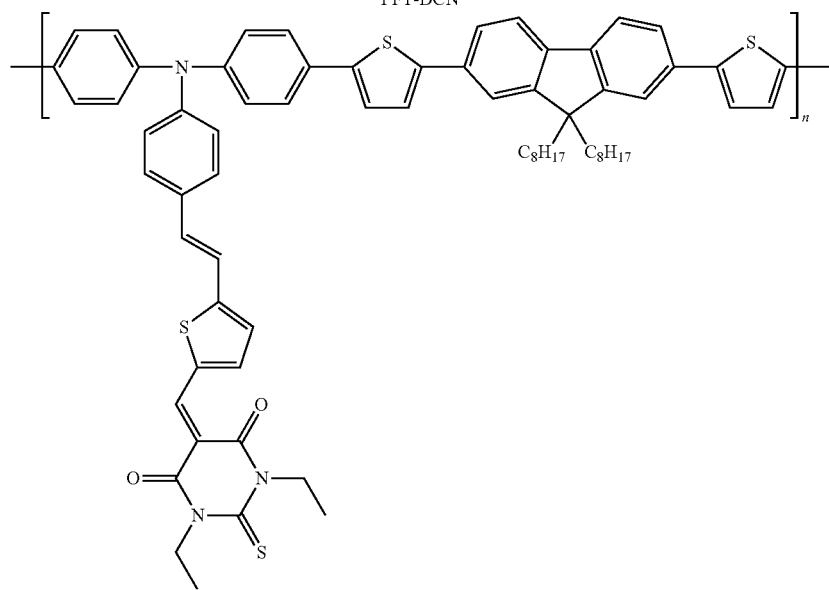
PFT-PDT

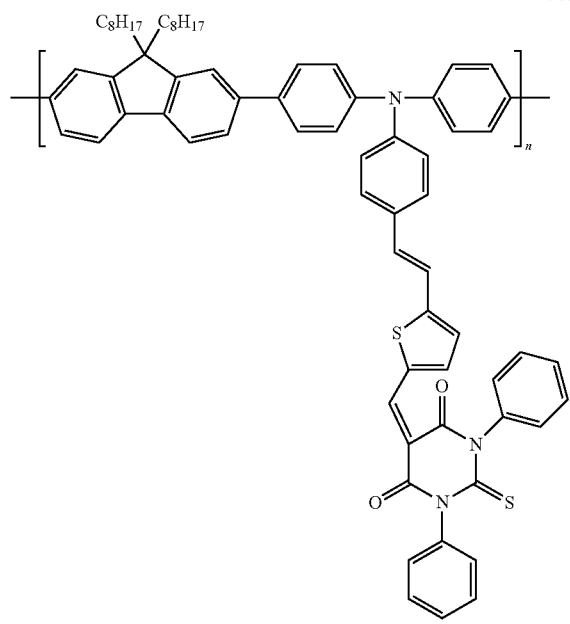
PFPPDT
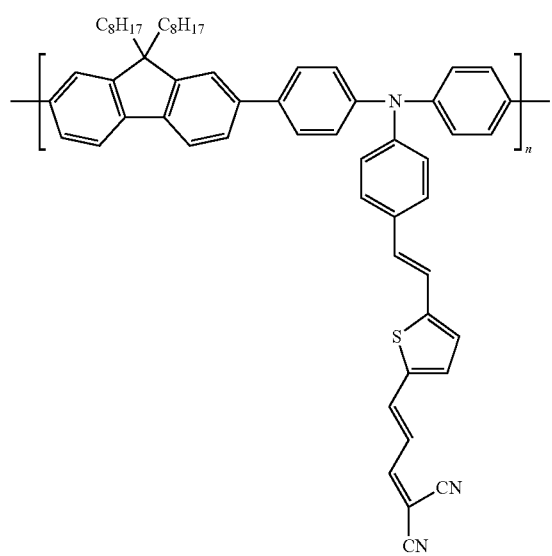
PFVDCN
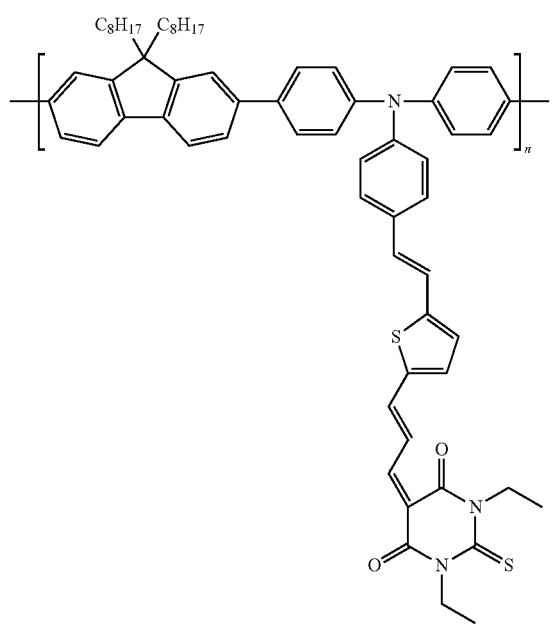
PFVPDT

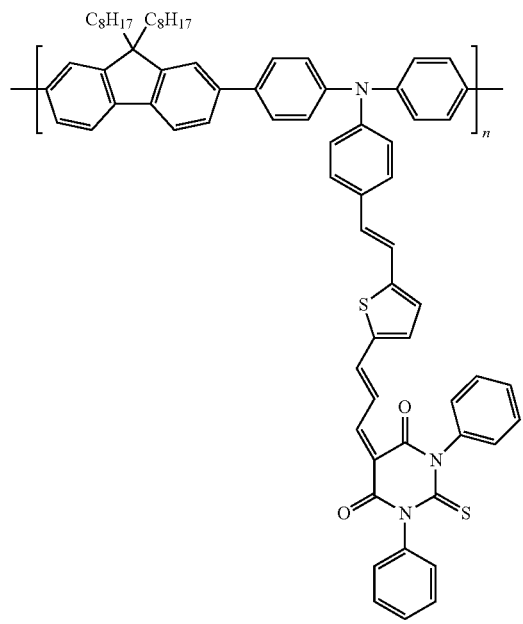
PFVPPDT
The following are representative examples of cross-conjugated D-A polymers of the invention having formula (II), where k is 2.
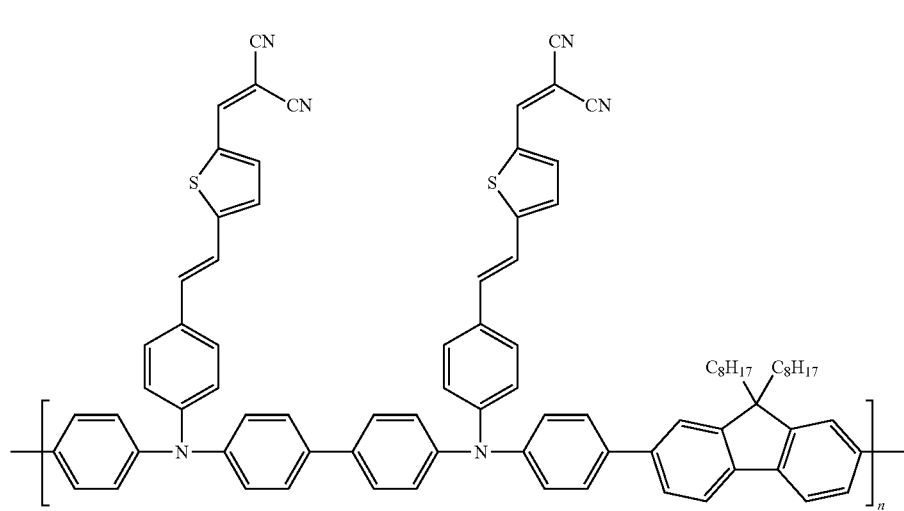
P1

P2
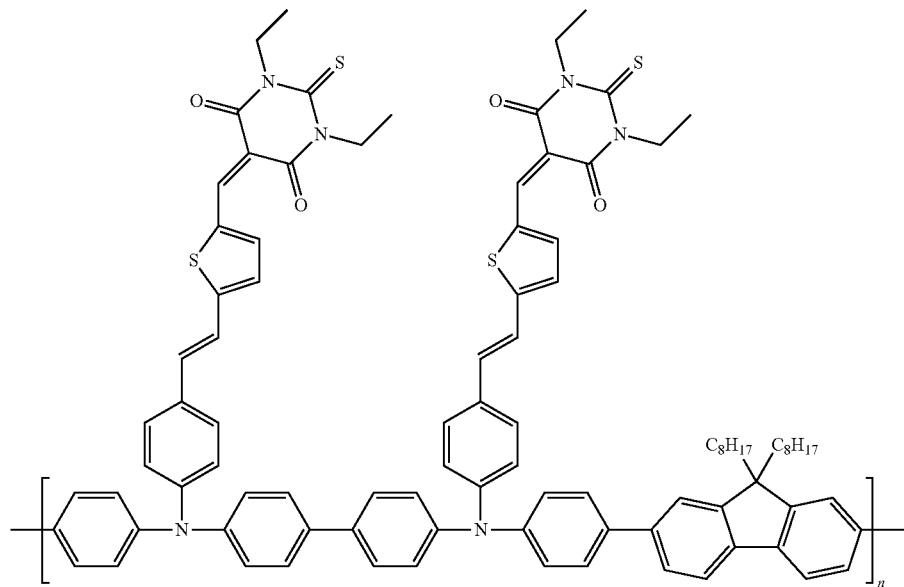
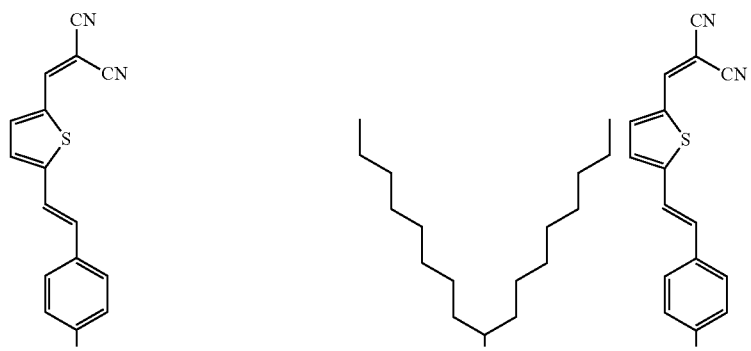
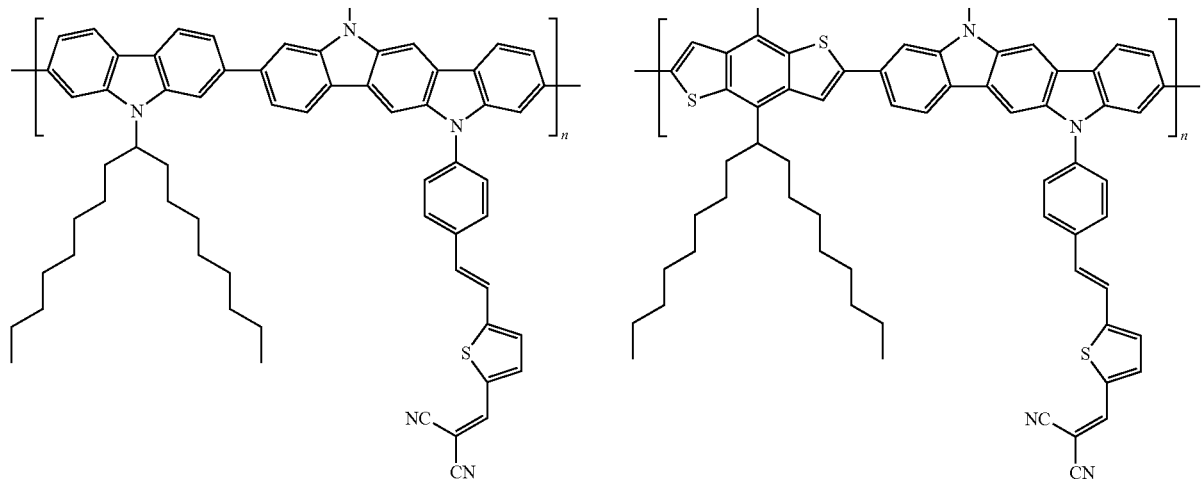

The following is a representative example of a cross-conjugated D-A polymer of the invention having formula (III), where k is 1:

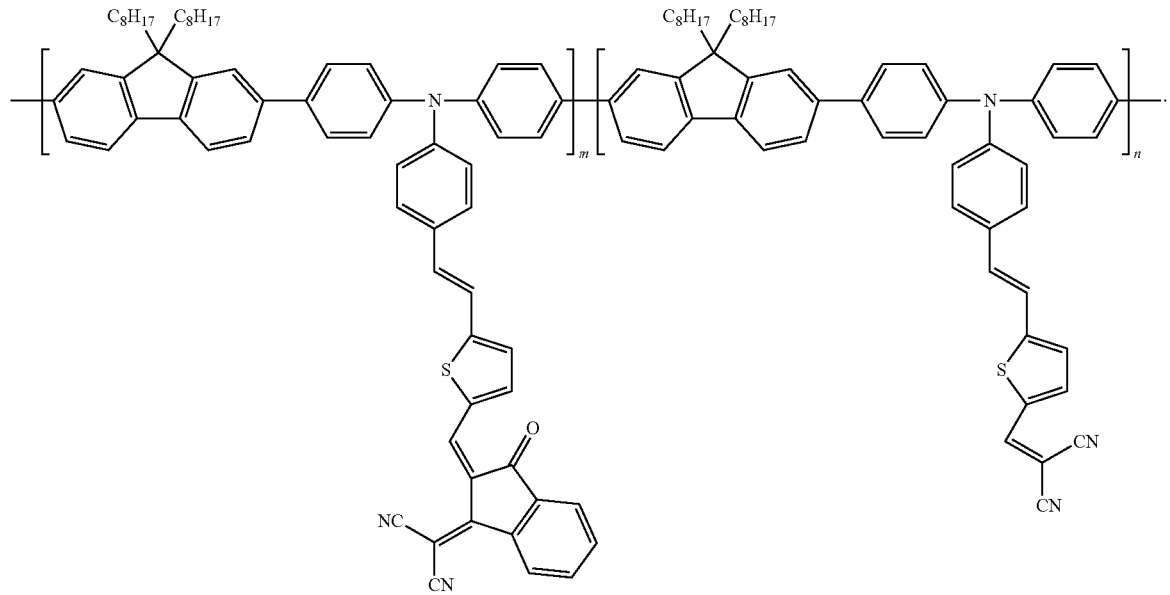

In another embodiment, the present invention provides a cross-conjugated D-A polymer with acceptor-containing side chains that further include a donor ($D_3$) conjugated to the acceptor ($A_4$). In this embodiment, donor $D_3$ is conjugated to acceptor $A_4$ either directly (q is 0) or through a π-bridge ($B_2$). These cross-conjugated D-A polymers of the invention are represented by the formula (IV):

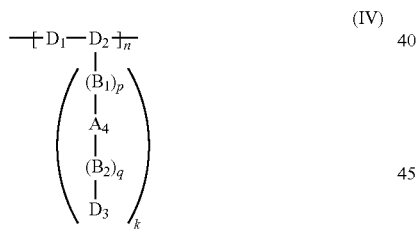

wherein $D_1$, $D_2$, and $D_3$ are electron-rich moieties (donor segments); $A_4$ is an electron-deficient moiety (acceptor segments); $B_1$ is a π-bridge moiety that conjugates $D_2$ to $A_4$; $B_2$ is a π-bridge moiety that conjugates $D_3$ to $A_4$; p and q are independently 0 or 1; k is 1 or 2; and n is an integer from 2 to 2000.

For formula (IV), $D_1$ and $D_2$ are as described above.

Donor $D_3$ at each occurrence is selected from the group consisting of substituted or unsubstituted triphenylamine, substituted or unsubstituted N,N-diphenyl-2-thiophenamine, substituted or unsubstituted 9-phenylcarbazole, substituted or unsubstituted 9-(2'-thiophene)-carbazole, substituted or unsubstituted 4-phenyldithienopyrrole, substituted or unsubstituted 4-(2'-thiophene)-dithienopyrrole, substituted or unsubstituted benzobisthiophene, substituted or unsubstituted tetraphenylbiphenyldiamine, and substituted or unsubstituted tetraphenylbenzenediamine. Representative donors include the following groups:

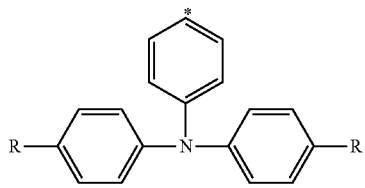

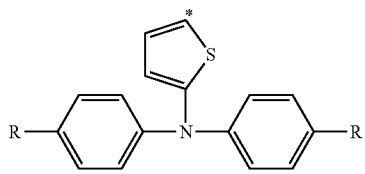

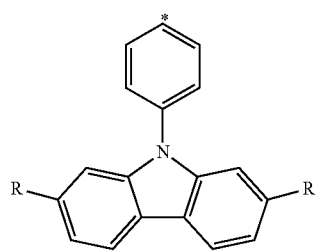

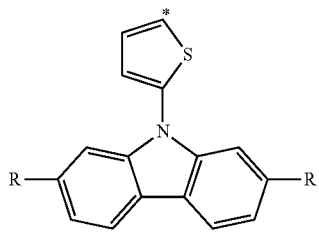

-continued

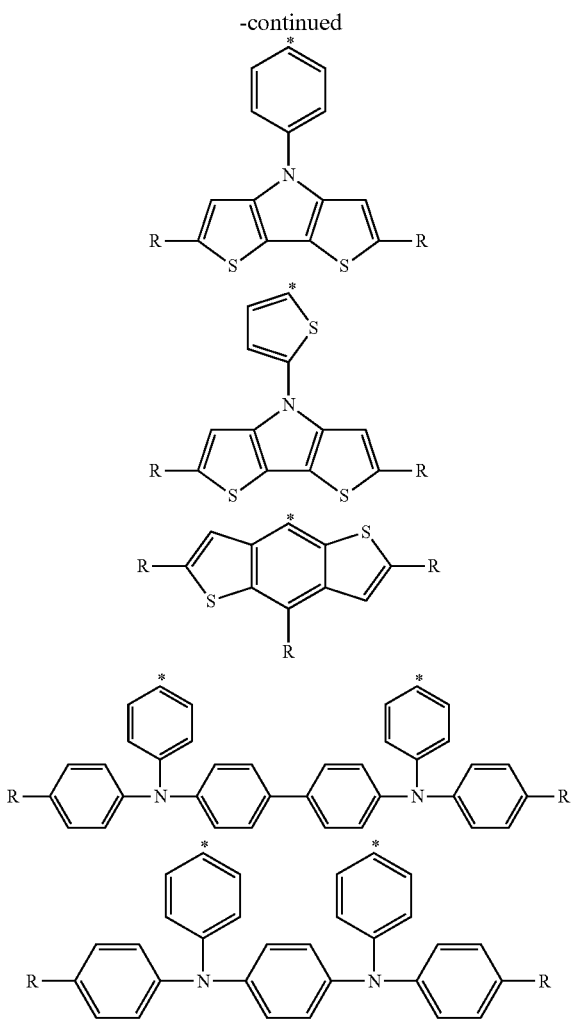

wherein R at each occurrence is independently selected from hydrogen, a C1-C20 linear or branched alkyl group, a C1-C20 linear or branched alkoxy group, a C1-C20 linear or branched dialkylamino group, and a C1-C20 linear or branched alkylthio group.

Acceptor $A_4$ at each occurrence is selected from the group consisting of benzobisthiadiazole, benzobisselenadiazole, thiadiazoloquinoxaline, thienopyrazine, and benzothiadiazole. Representative acceptors include the following groups:

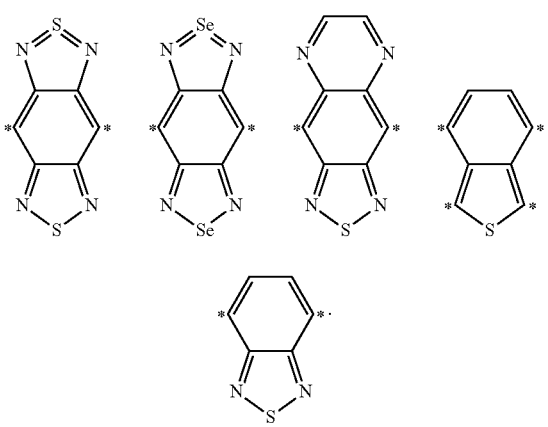

π-Bridges $B_1$ and $B_2$ at each occurrence are independently selected from the group consisting of substituted or unsubstituted benzene, substituted or unsubstituted thiophene, substituted or unsubstituted fluorene, substituted or unsubstituted carbazole, and substituted or unsubstituted bithiophene. Representative bridges include the following groups:

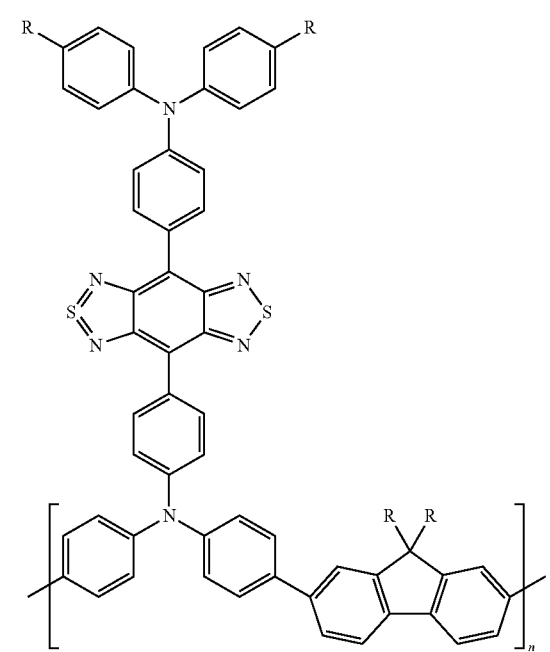

wherein R at each occurrence is independently selected from hydrogen, a C1-C20 linear or branched alkyl group, a C1-C20 linear or branched alkoxy group, a C1-C20 linear or branched dialkylamino group, and a C1-C20 linear or branched alkylthio group.

The following are representative examples of cross-conjugated D-A conjugated polymers of the invention (formula (IV) having side chains that further include donor segments:

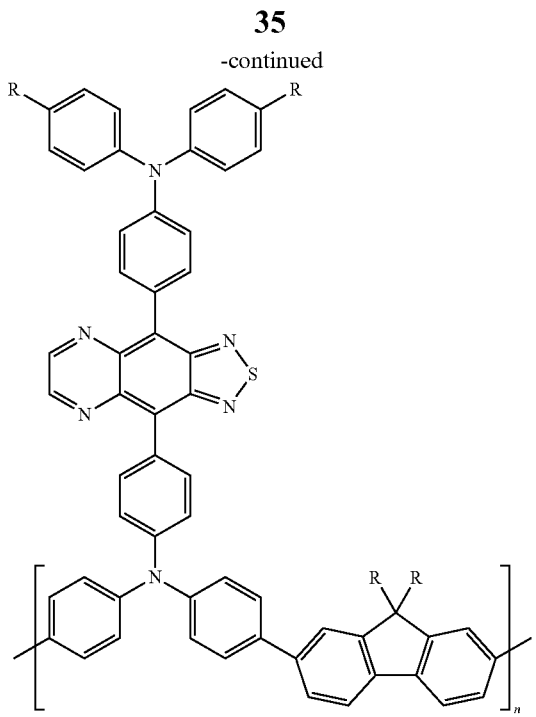

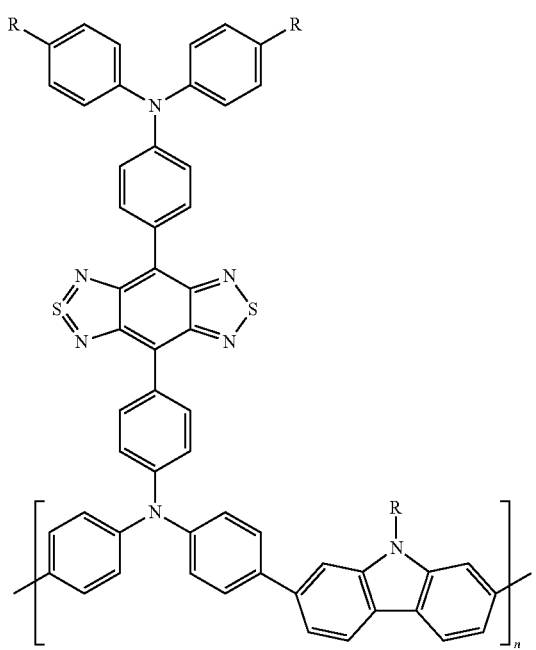

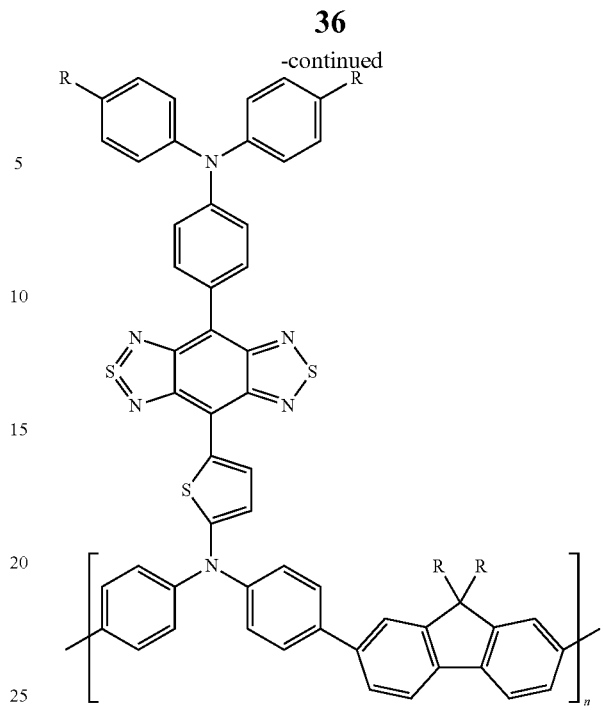

wherein R at each occurrence is independently selected from hydrogen, a C1-C20 linear or branched alkyl group, a C1-C20 linear or branched alkoxy group, a C1-C20 linear or branched dialkylamino group, and a C1-C20 linear or branched alkylthio group.

In another aspect, the invention provides a method of making a cross-conjugated D-A polymers of the invention. In one embodiment, the cross-conjugated polymer is obtained by Knoevenagel condensation of one or more than one type of electron-acceptor compounds with an aldehyde-functionalized polymer having the formula (V):

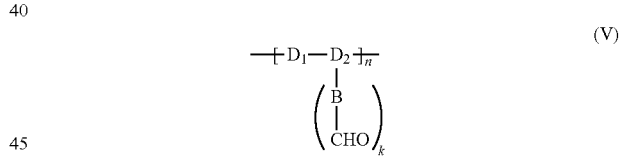

(V)

to provide a polymer having the formula (VI):

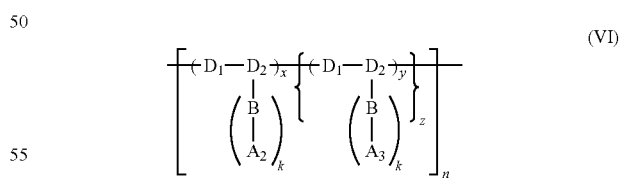

(VI)

where $D_1$, $D_2$, $A_1$, $A_2$, B, n, and k are as described above for formulas (II) and (III), x and y are molar percentages of acceptor compounds reacted with CHO, x+y=100%, and z is an integer $\geq 0$.

Suitable electron-acceptor compounds include malononitrile, cyano-(3-cyano-4,5,5-trimethyl-5H-furan-2-ylidene)-acetic acid ethyl ester, 2-(3-cyano-4,5,5-trimethyl-5H-furan-2-ylidene)-malononitrile, 1,3-diethyl-2-thioxo-dihydro-pyrimidine-4,6-dione, 2-ethylidene-malononitrile, 1,3-diethyl-5-ethylidene-pyrimidine-2,4,6-trione, 2-(3-cyano-5, 5-dimethyl-4-propenyl-5-furan-2-ylidene)-malononitrile, 5-ethylidene-1,3-diphenyl-2-thioxo-dihydro-pyrimidine-4, 6-dione, 2-(2-ethylidene-3-oxo-indan-1-ylidene)-malononitrile, 2-[1-(2,3,5,6-tetrafluoro-pyridin-4-yl)-ethylidene]-malononitrile, and cyano-(3-cyano-4,5,5-trimethyl-5-furan-2-ylidene)-acetic acid ethyl ester.

Figure 12:
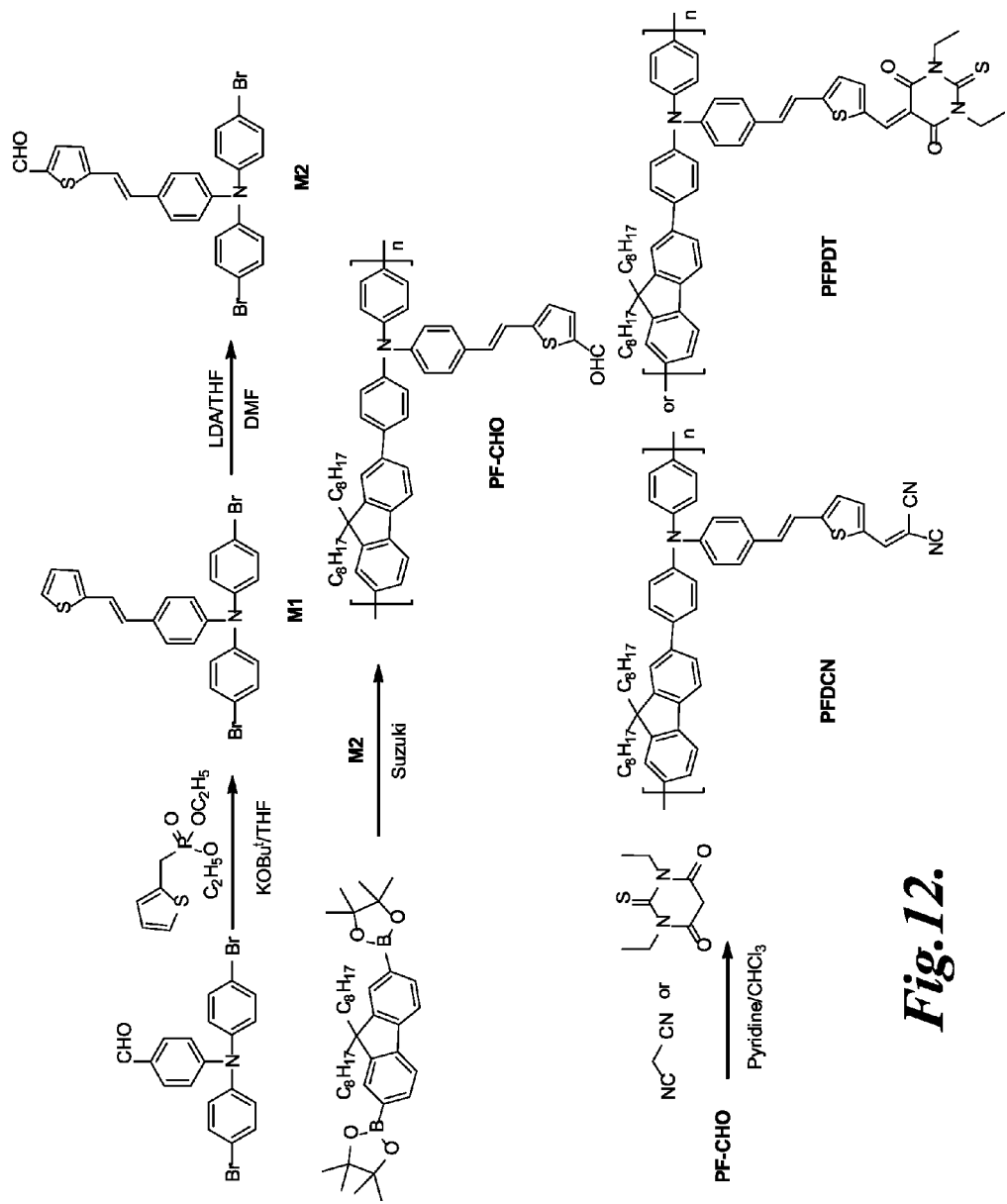
FIG. 12 is a schematic illustration of the preparation of representative cross-conjugated D-A polymers of the invention.

The preparation of representative polymers of the invention are described in Example 1 and illustrated in FIG. 12.

The cross-conjugated D-A polymers of the present invention (formulas (II), (III), (IV) and (VI)) can be employed as the electron donor component in the active layer of an electronic device (such as a photovoltaic device or a field-effect transistor). Representative photovoltaic devices include solar cells, solar windows, and photodetectors. Representative devices of the invention are illustrated in FIGS. 1-4.

FIG. 1 is a cross-sectional view of a representative heterojunction photovoltaic device in accordance with one embodiment of the invention. Referring to FIG. 1, photovoltaic device 100 includes first electrode 110, photovoltaic layer 120 formed on electrode 110, and second electrode 130 formed on photovoltaic layer 120. Photovoltaic layer 120 includes one or more of cross-conjugated D-A polymers of the invention as the electron-donor component.

Figure 2:
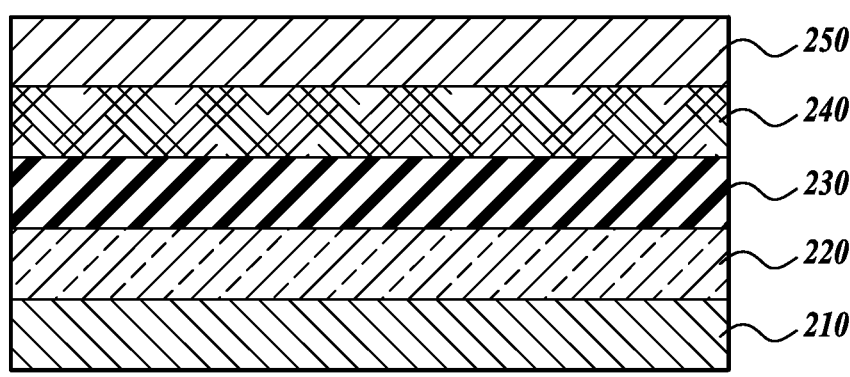
FIG. 2 is a cross-sectional view of a representative photovoltaic device with charge-accepting layers incorporating one or more representative cross-conjugated polymers of the invention in the active layer.

FIG. 2 is a cross-sectional view of a representative heterojunction photovoltaic device in accordance with one embodiment of the invention. Referring to FIG. 2, photovoltaic device 200 includes first electrode 210, first charge-accepting layer 220 formed on first electrode 210, photovoltaic layer 230 formed on first charge-accepting layer 220, second charge-accepting layer 240 formed on photovoltaic layer 230, and second electrode 250 formed on second charge-accepting layer 240. Photovoltaic layer 230 includes one or more of cross-conjugated D-A polymers of the invention as the electron-donor component.

Figure 3:
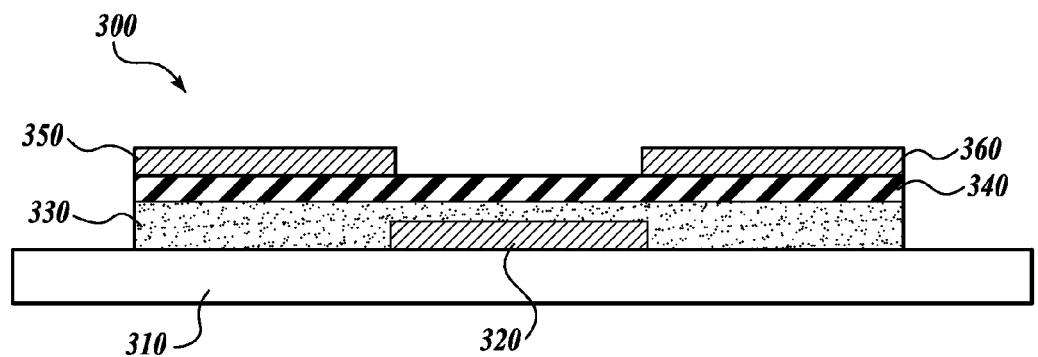
FIG. 3 is a cross-sectional view of a representative top contact field-effect transistor device incorporating one or more representative cross-conjugated polymers of the invention in the active layer.

FIG. 3 is a cross-sectional view of a representative top-contact field-effect transistor device in accordance with one embodiment of the invention. Referring to FIG. 3, field-effect transistor device 300 includes substrate 310, gate electrode 320 formed on substrate 310, insulating layer 330 formed on substrate 310 and gate electrode 320, semiconductor layer 340 formed on insulating layer 330, and source electrode 350 and drain electrode 360 formed on semiconductor layer 340. Semiconductor layer 340 includes one or more of cross-conjugated D-A polymers of the invention as the electron-donor component.

Figure 4:
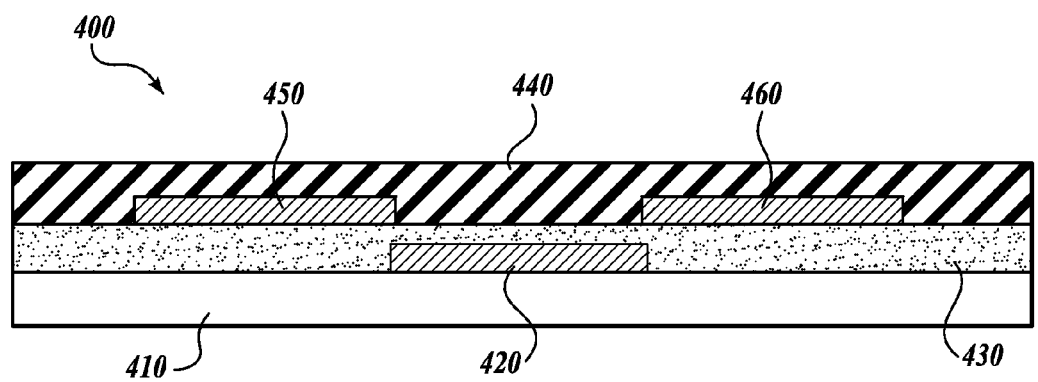
FIG. 4 is a cross-sectional view of a representative bottom contact field-effect transistor device incorporating one or more representative cross-conjugated polymers of the invention in the active layer.

FIG. 4 is a cross-sectional view of a representative bottom-contact field-effect transistor device in accordance with one embodiment of the invention. Referring to FIG. 4, field-effect transistor device 400 includes substrate 410, gate electrode 420 formed on substrate 410, insulating layer 430 formed on substrate 410 and gate electrode 420, source electrode 450 and drain electrode 460 formed on insulating layer 430 and semiconductor layer 440 formed on insulating layer 430, source electrode 450, and drain electrode 460. Semiconductor layer 440 comprises one or more of cross-conjugated D-A polymers of the invention as the electron-donor component.

The following describes two representative cross-conjugated polymers of the invention, PFDCN and PFPDT, and their use in PSCs.

Figure 5:
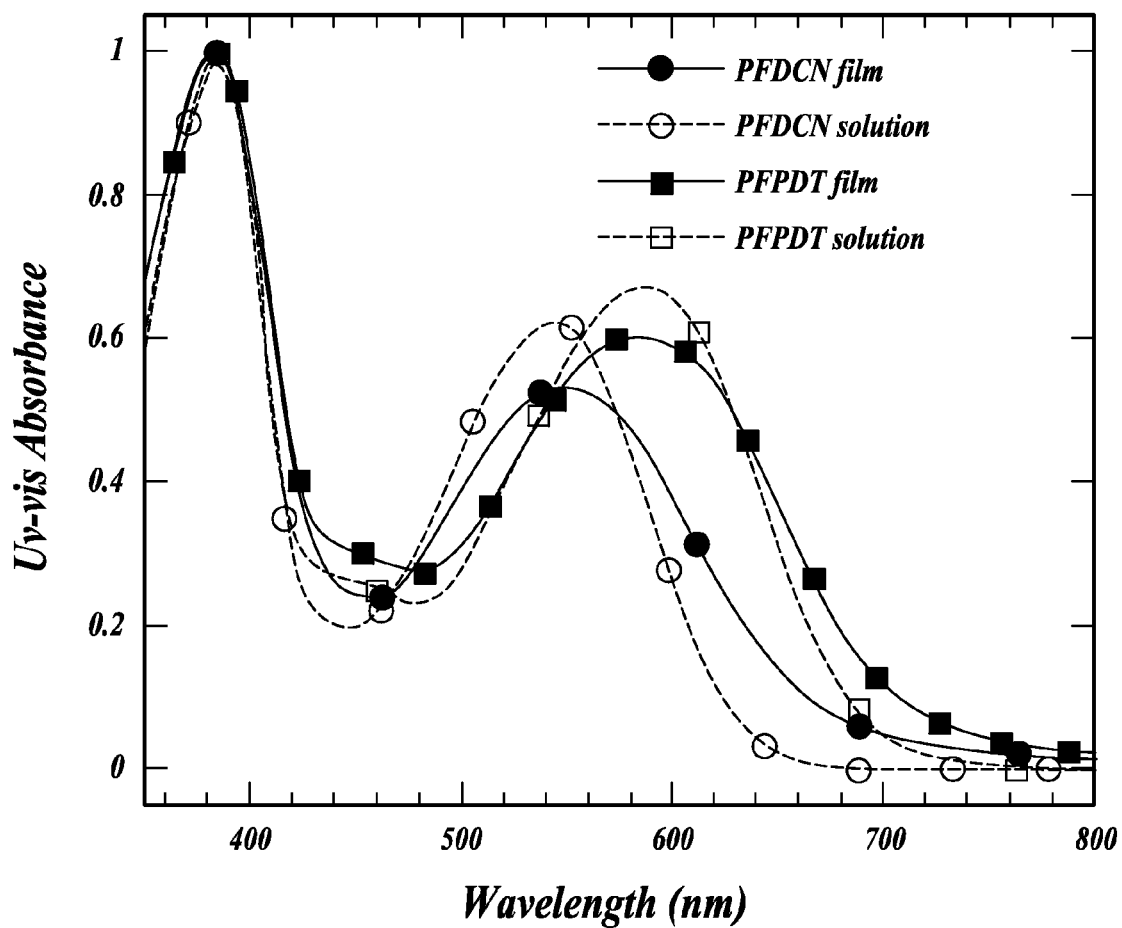
FIG. 5 compares the absorption spectra of two representative cross-conjugated polymers of the invention, PFDCN and PFPDT, in chloroform solution and in a film.
Figure 6:
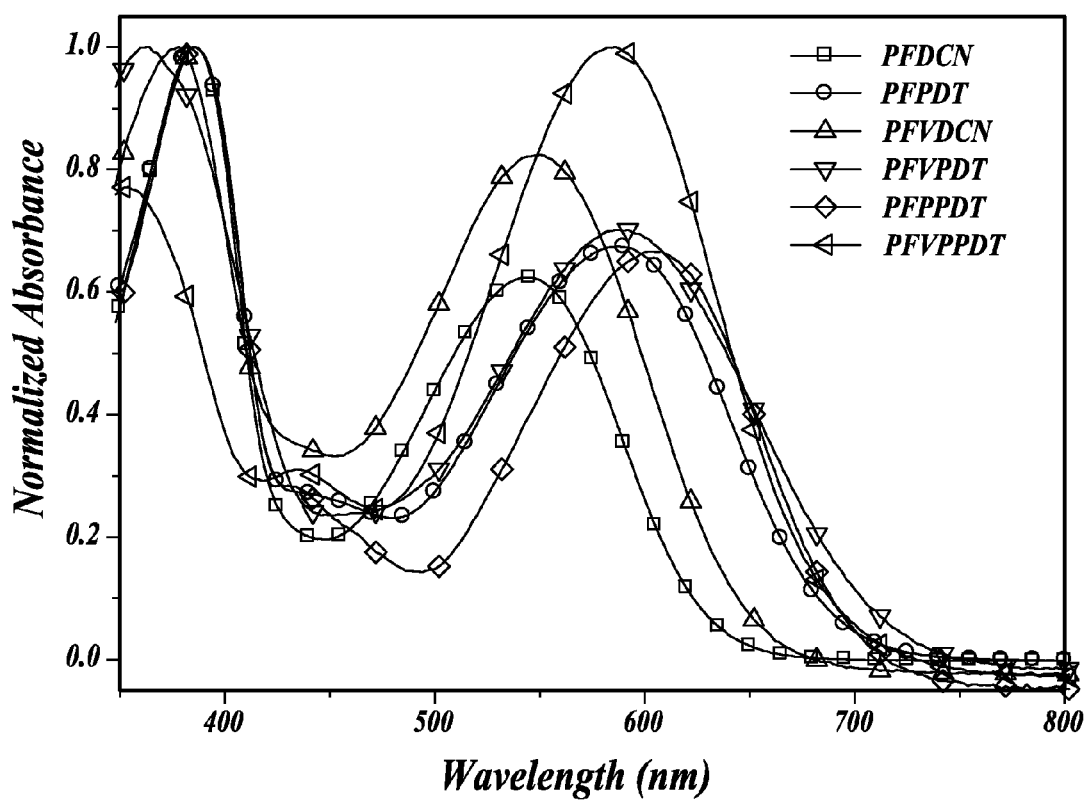
FIG. 6 compares the absorption spectra of representative cross-conjugated polymers having a single acceptor type.
Figure 7:
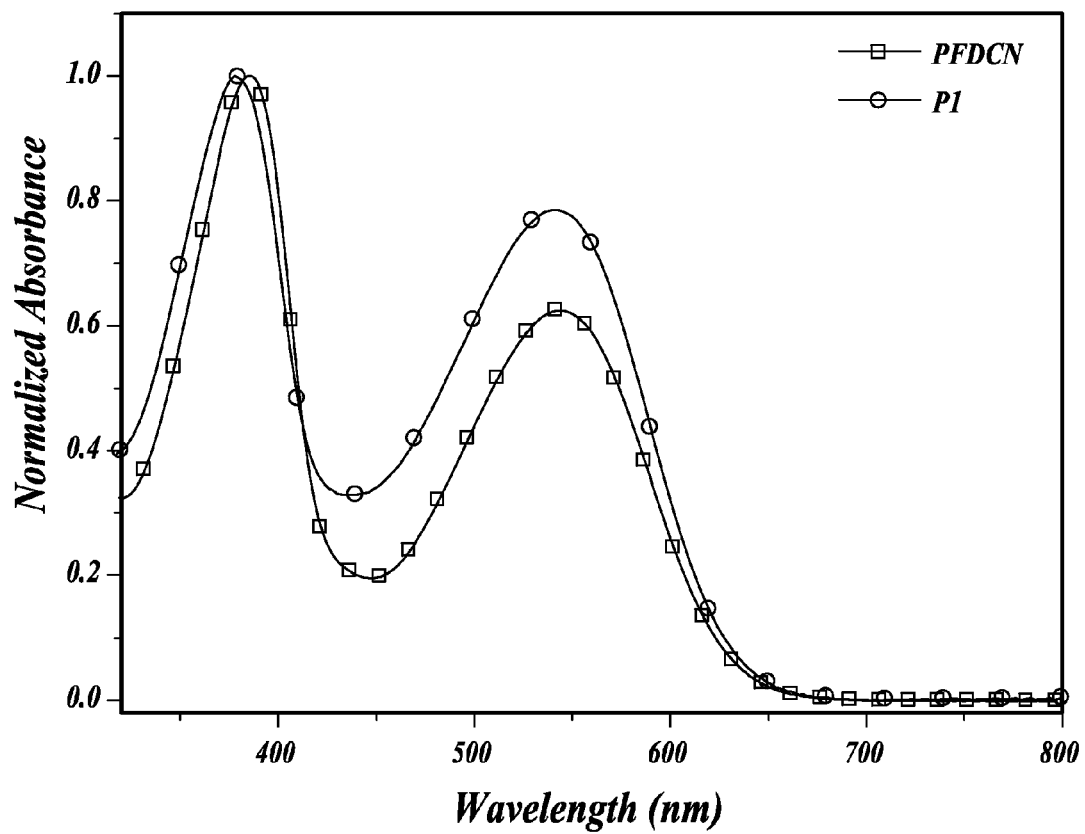
FIG. 7 compares the absorption spectra of representative cross-conjugated polymers of the invention, PFDCN and P1, illustrating enhanced absorption due to increasing acceptor density.
Figure 8:
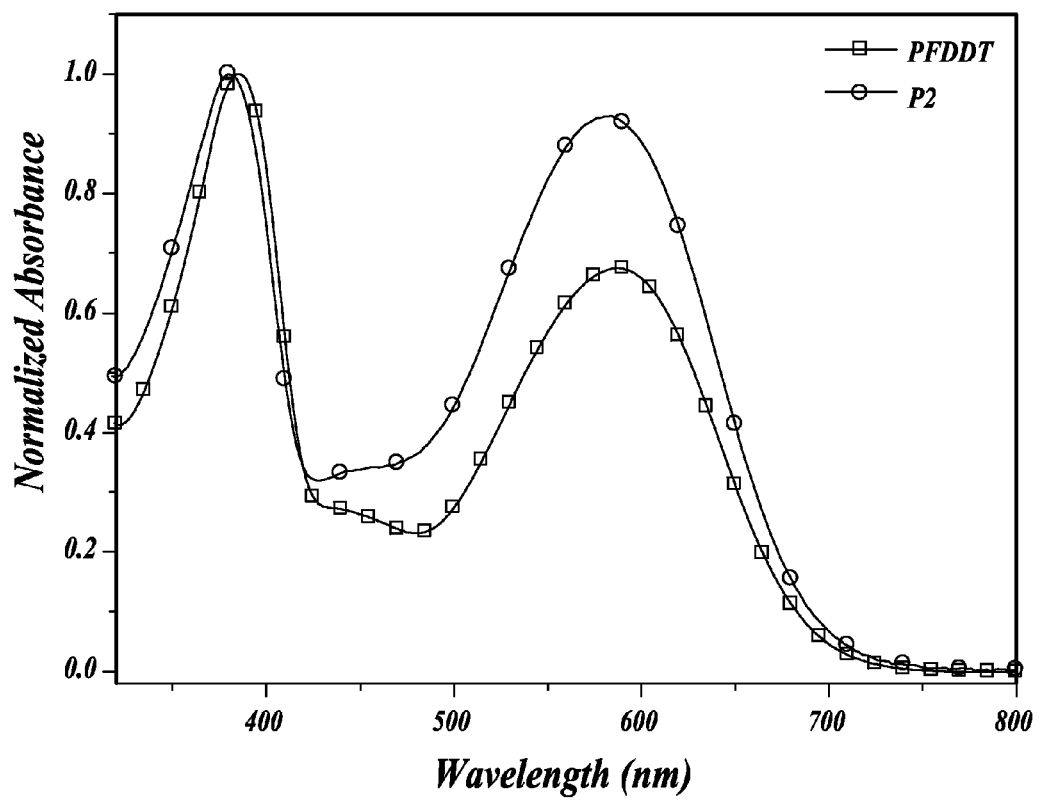
FIG. 8 compares the absorption spectra of representative cross-conjugated polymers of the invention, PFPDT and P2, illustrating enhanced absorption due to increasing acceptor density.
Figure 9:
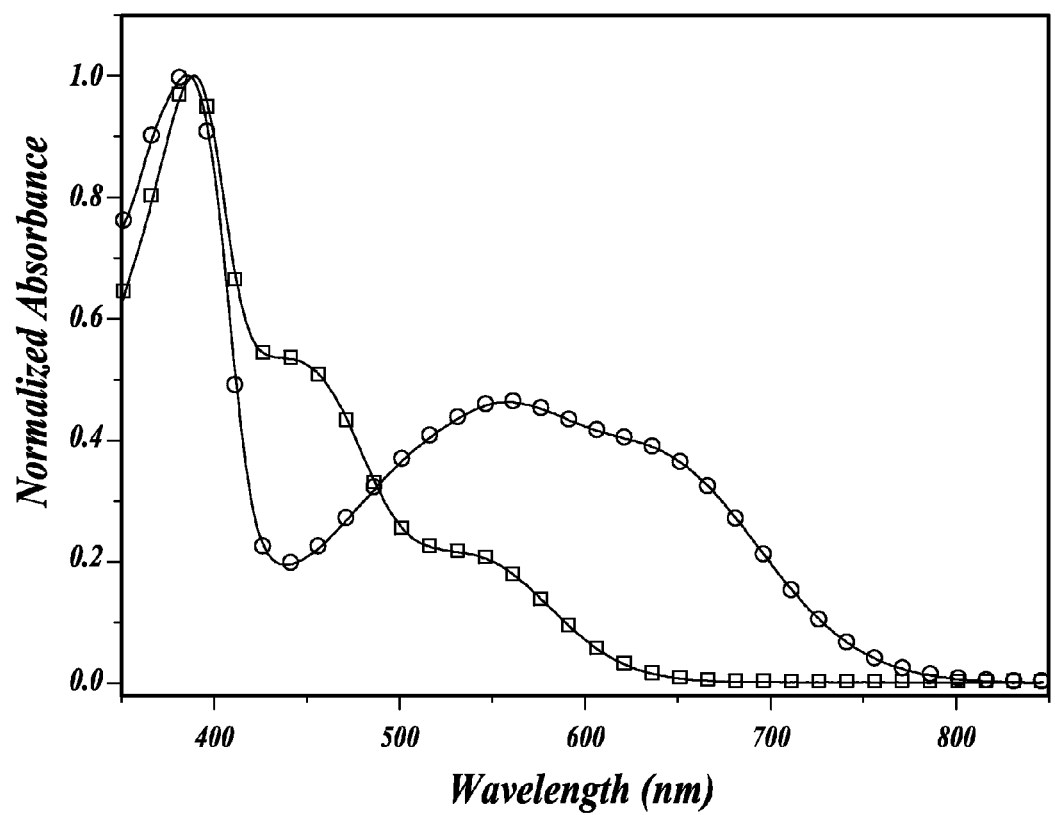
FIG. 9 compares the absorption spectra of PFDCN-PFCHO pre-polymer and PFDCN-PFPDT copolymer having two acceptor types coupled to the same polymer main chain.
Figure 10:
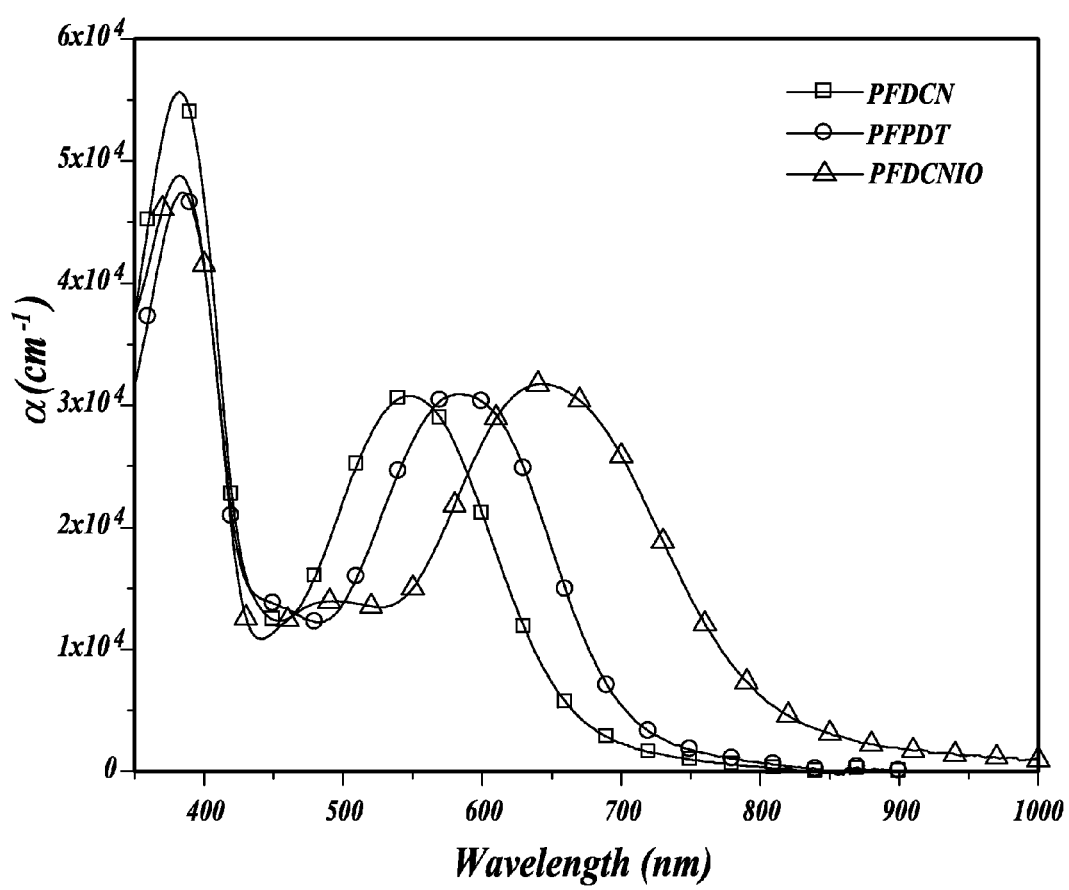
FIG. 10 compares the absorption spectra of representative cross-conjugated polymers of the invention: PFDCN, PFPDT, and PFDCNIO.
Figure 11:
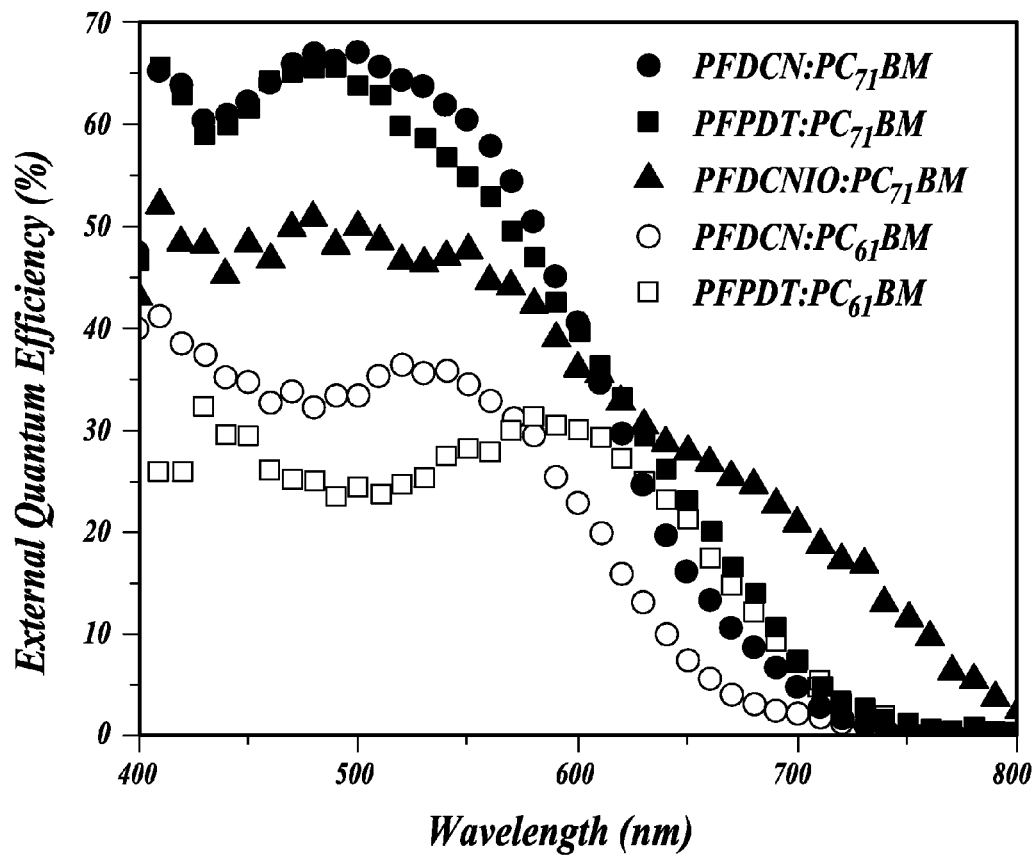
FIG. 11 compares the photocurrent spectral response of photodetectors based on cross-conjugated polymer-PCBM blends.

PFDCN and PFPDT were obtained by a Knoevenagel condensation of an aldehyde-functionalized conjugated precursor polymer with malononitrile and diethylthiobarbituric acid, respectively. Due to their cross-conjugated side chains, both polymers are amorphous and have good solubility in common organic solvents such as tetrahydrofuran, chloroform, toluene and xylene. The weight-average molecular weight of PFDCN and PFPDT are 17.7 and 16.3 kg/mol with a polydispersity index of 1.7 and 1.6, respectively. Differential scanning calorimetry (DSC) studies show that the glass transition temperatures ($T_g$) were 155 and 163° C. for PFDCN and PFPDT, respectively. No crystallization and melting peak was observed upon further heating beyond the $T_g$. Absorption spectra of the polymers in solution are shown in FIG. 5. Each shows two absorption peaks: the first absorption has a maximum at around 385 nm corresponding to the π-π* transition of their conjugated main chains and the other absorption corresponds to the strong ICT characteristics of their side chains. The optical band gap of PFDCN calculated from the onset of the film absorption is 1.87 eV. By using a stronger acceptor, PFPDT exhibits a more prominent red-shifted ICT peak than does PFDCN, which has a lesser optical band gap of 1.76 eV. The energy levels of the polymers were investigated by cyclic voltammetry (CV). The HOMO energy level of PFDCN and PFPDT are calculated to be −5.47 and −5.46 eV, respectively (using the ferrocene value of −4.8 eV below the vacuum as the internal standard). The LUMO of PFDCN and PFPDT are −3.60 and −3.70 eV, respectively, determined by estimation from its optical band gap and HOMO energy. Clearly, each of the polymers exhibit similar HOMO levels due to their common main chain, while the acceptors on the side chain determine their LUMO levels.

The photovoltaic properties of PFDCN and PFPDT were studied in PSCs devices with the structure of ITO/PEDOT:PSS/polymers:PC71BM (1:4, w/w)/Ca/Al. The PC71BM was used as the electron acceptor because it has similar electronic properties to PC61BM, but a much stronger absorption in the visible region with a broad peak from 440 nm to 530 nm, which complements the absorption valley of the polymers. Both polymers exhibit promising photovoltaic properties with the average PCE of 4.49% and 4.19% for PFDCN and PFPDT, respectively. A PCE up to 4.76% was observed from the solar cells made by PFDCN: PC71BM with an open circuit voltage ($V_{oc}$) of 0.99 V, a short circuit current density ($J_{sc}$) of 9.66 mA/cm$^2$, and a fill factor of 50.0%. The maximum PCE of PFPDT: PC71BM based solar cells also reaches 4.37% with a Voc of 0.99 V, a Jsc of 9.61 mA/cm$^2$, and a fill factor of 46.0%.

The PSCs device performance based on cross-conjugated polymers PFDCN and PFPDT are comparable to those based on linear narrow band gap D-A conjugated polymers, and it is worth noting that all performances for the cross-conjugated polymers were obtained without complicate post-treatments. Several factors contribute to their excellent photovoltaic properties and make them promising candidates for PSCs materials. First, both PFDCN and PFPDT-based PSCs devices exhibited a much greater Voc (0.99 V) compared to most of previous reported small band gap materials, due to their relative low HOMO level, which can be readily controlled by adjusting the main chain donor. Second, their absorption can be easily tuned by controlling the acceptor strength on the side chain, or using more efficient π-bridge, without disturbing their conjugated main chain structure. A concern of cross-conjugated polymers is their hole mobility compare to those linear polymers because of their amorphous nature resulting from their bulky and rigid side chains. Hole mobility of the polymers: PC71BM blend films were measured by space charge limited current (SCLC) method, which has been widely used to estimate the charge transport ability of PSCs active layers. The PFDCN film exhibited a hole mobility of 4.3×10$^{-4}$ cm$^2$V$^{-1}$ s$^{-1}$ and the PFPDT film exhibited a hole mobility of 2.6×10$^{-4}$ cm$^2$V$^{-1}$ s$^{-1}$, which are comparable to that of regioregular P3HT in the same condition. Moreover, due to their cross-conjugated structure, PFDCN and PFPDT have an improved isotropic charge transport ability than those linear D-A conjugated polymers, which is advantageous for PSC applications.

The following examples are provided for the purpose of illustrating, not limiting, the invention.

EXAMPLES

Example 1

The Preparation of Representative Cross-Conjugated Polymers: PDFCN and PFPDT In this example, the preparations of representative cross-conjugated polymers of the invention, PDFCN and PFPDT, is described. The preparations are illustrated schematically in FIG. 12.

2-[2-[4-[N,N-Di(4-bromophenyl)amino]phenyl]ethenyl]thiophene (M1)

To a solution of 5.0 g (11.6 mmol) of 4-[N,N-di(4-bromophenyl)amino]benzaldehyde and 3.0 g (12.8 mmol) of diethyl (2-methylthiophene)phosphonate in 50 mL of dry THF was added 12.8 mL of 1 M potassium tert-butoxide methanol solution. The reaction mixture was stirred overnight at room temperature and then was diluted with dichloromethane and water. The two phases were separated, and the water phase was extracted twice with dichloromethane. The combined organic extracts were washed three times with water, dried over magnesium sulfate, evaporated, and purified with column chromatography (silica gel, hexane/dichloromethane (3/1) as eluent to yield 5.8 g (88%) of 2-[2-[4-[N,N-Di(4-bromophenyl)amino]phenyl]ethenyl]thiophene (M1) as a yellowish solid. $^1$H NMR (CDCl$_3$, ppm): 7.41-7.38 (m, 6H), 7.21 (d, 1H), 7.17 (d, J=16.0 Hz, 1H), 7.08 (d, 1H), 7.04 (m, 1H), 7.03-7.02 (m, 2H), 7.01-6.98 (m, 4H), 6.90 (d, J=16.0 Hz, 1H). 13C NMR (CDCl$_3$, ppm): 150.24, 147.03, 136.45, 136.26, 131.65, 131.51, 131.39, 129.88, 129.70, 128.17, 128.15, 124.92, 119.82. HRMS (ESI) (M$^+$, C$_{24}$H$_{17}$Br$_2$NS): calcd, 508.9448; found, 508.9430.

2-[2-[4-[N,N-Di(4-bromophenyl)amino]phenyl]ethenyl]thien-5-al (M2)

Under argon atmosphere, 10 mL (10 mmol, 1 M in THF) of a lithium diisopropylamide (LDA) solution was added dropwise to a solution of 3.8 g (7.4 mmol) of M1 in 50 mL of dry THF at −78° C. The reaction mixture was warmed to 0° C. and stirred for 30 min. Then, 2 mL of dry DMF was added at −40° C., and the mixture was stirred for 1 h at room temperature, after which 50 mL of a HCl solution (0.1 M) was carefully added. After 1 h of stirring, the product was extracted with dichloromethane and the combined organic layers were washed three times with water, dried over magnesium sulfate, evaporated, and purified with column chromatography (silica gel, hexane/dichloromethane (3/1) as eluent) to yield 2.2 g (55%) 2-[2-[4-[N,N-di(4-bromophenyl)amino]phenyl]ethenyl]thien-5-al (M2) as orange-red solid. $^1$H NMR (CDCl$_3$, ppm): 9.87 (s, 1H), 7.67 (d, J=4.0 Hz, 1H), 7.40-7.38 (m, 6H), 7.13 (d, J=4.0 Hz, 1H), 7.11 (d, 2H), 7.03 (d, 2H), 6.98 (d, 4H). 13C NMR (CDCl$_3$, ppm): 186.55, 156.78, 151.43, 149.95, 145.27, 141.37, 136.58, 136.18, 134.66, 132.11, 130.25, 130.11, 127.46, 123.57, 120.38. HRMS (ESI) (M$^+$, C$_{25}$H$_{17}$Br$_2$NOS): calcd, 536.9398; found, 536.9381.

PF-CHO.

2,7-Bis(4,4,5,5-tetramethyl-1,3,2-dioxaborolan-2-yl)-9,9-dioctyl-fluorene 0.642 g (1.000 mmol), and 2-[2-[4-[N,N-Di(4-bromophenyl)amino]-phenyl]ethenyl]thien-5-al (M2) 0.511 g (1.000 mmol) were placed in a 25 mL round-bottomed flask. A mixture of 2 M K$_2$CO$_3$ aqueous solution (3 mL) and toluene (10 mL) were added to the flask and the reaction mixture was degassed. The mixture was refluxed with vigorous stirring for 3 days under nitrogen atmosphere. After the mixture was cooled to room temperature and poured into 200 mL of methanol. The precipitated material was recovered by filtration. The resulting solid material was washed for 24 h with acetone to remove oligomers and catalyst residues (0.879 g, 73%). $^1$H NMR (CDCl$_3$, ppm): 9.89 (s, 1H), 7.82-7.80 (m, 2H), 7.70-7.59 (m, 9H), 7.47-7.45 (m, 2H), 7.33-7.31 (m, 3H), 7.23-7.21 (m, 2H), 7.17 (m, 4H), 2.08 (m, 4H), 1.23-1.11 (m, 20H), 0.83 (t, 6H), 0.77 (m, 4H).

PFDCN.

To a solution of PF-CHO (100 mg, 0.13 mmol) and malononitrile (172 mg, 2.6 mmol) in 10 mL chloroform was added to 0.1 mL of pyridine. The mixture solution was stirred overnight at room temperature after which the resulting mixture was poured into methanol and the precipitate was filtered off and washed with water. The resulted polymer was purified by repeated precipitation from its THF solution to methanol twice (91 mg, 86%). $^1$H NMR (CDCl$_3$, ppm): 7.82-7.80 (m, 2H), 7.77 (s, 1H), 7.69-7.61 (m, 9H), 7.48-7.46 (m, 2H), 7.33-7.32 (m, 3H), 7.26-7.15 (m, 6H), 2.08 (m, 4H), 1.23-1.11 (m, 20H), 0.83 (t, 6H), 0.77 (m, 4H). GPC (THF, polystyrene standard) M$_w$=1.77×10$^4$ g/mol, PDI=1.7.

PFPDT.

To a solution of PF-CHO (100 mg, 0.13 mmol) and 1,3-diethyl-2-thiobarbituric acid (260 mg, 1.3 mmol) in 10 mL chloroform was added to 0.1 mL of pyridine. The mixture solution was stirred overnight at room temperature after which the resulting mixture was poured into methanol and the precipitate was filtered off and washed with water. The resulted polymer was purified by repeated precipitation from its THF solution to methanol twice (102 mg, 83%). $^1$H NMR (CDCl$_3$, ppm): 8.66 (s, 1H), 7.83-7.81 (m, 3H), 7.74-7.62 (m, 9H), 7.51-7.49 (m, 2H), 7.46-7.43 (m, 1H), 7.34-7.30 (m, 4H), 7.23-7.20 (m, 3H), 4.67-4.61 (m, 4H), 2.09 (m, 4H), 1.43-1.34 (m, 6H), 1.23-1.11 (m, 20H), 0.83 (t, 6H), 0.76 (m, 4H). GPC (THF, polystyrene standard) M$_w$=1.63×10$^4$ g/mol, PDI=1.6.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A polymer comprising repeating units having the structure:

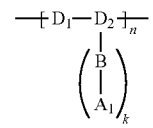

wherein
D$_1$ is a first donor segment;
D$_2$ is a second donor segment, wherein D$_2$ at each occurrence is selected from the group consisting of triphenylamine, N,N-diphenyl-2-thiophenamine, 9-phenylcarbazole, 9-(2'-thiophene)-carbazole, 4-phenyldithienopyrrole, 4-(2'-thiophene)-dithienopyrrole, 6,12-diphenylindolocarbazole, tetraphenylbiphenyldiamine, and tetraphenylbenzenediamine;

$A_1$ is an acceptor segment;
B is a π-bridge moiety that conjugates $D_2$ to $A_1$;
k is 1 or 2; and
n is an integer from 2 to 2000.

2. The polymer of claim 1, wherein $D_1$ at each occurrence is selected from the group consisting of substituted or unsubstituted triphenylamine, substituted or unsubstituted fluorene, substituted or unsubstituted indenofluorene, substituted or unsubstituted cyclopentadithiophene, substituted or unsubstituted 2,2'-fluorenebisthiophene, substituted or unsubstituted carbazole, substituted or unsubstituted indolocarbazole, substituted or unsubstituted silafluorene, substituted or unsubstituted silolodithiophene, substituted or unsubstituted dithienopyrrole, and substituted or unsubstituted benzobisthiophene.

3. The polymer of claim 1, wherein $A_1$, $A_2$, and $A_3$ at each occurrence are independently selected from the group consisting of malononitrile, cyano-(3-cyano-4,5,5-trimethyl-5H-furan-2-ylidene)-acetic acid ethyl ester, 2-(3-cyano-4,5,5-trimethyl-5H-furan-2-ylidene)-malononitrile, 1,3-diethyl-2-thioxo-dihydro-pyrimidine-4,6-dione, 2-ethylidene-malononitrile, 1,3-diethyl-5-ethylidene-pyrimidine-2,4,6-trione, 2-(3-cyano-5,5-dimethyl-4-propenyl-5-furan-2-ylidene)-malononitrile, 5-ethylidene-1,3-diphenyl-2-thioxo-dihydro-pyrimidine-4,6-dione, 2-(2-ethylidene-3-oxo-indan-1-ylidene)-malononitrile, 2-[1-(2,3,5,6-tetrafluoro-pyridin-4-yl)-ethylidene]-malononitrile, and cyano-(3-cyano-4,5,5-trimethyl-5-furan-2-ylidene)-acetic acid ethyl ester.

4. The polymer of claim 1, wherein B at each occurrence is selected from the group consisting of substituted or unsubstituted phenylenevinylene thienylenevinylene, substituted or unsubstituted thienylenevinylene, substituted tetraene, substituted or unsubstituted bithiophene, and substituted or unsubstituted tetrathiophene.

5. A photovoltaic device, comprising:
(a) a hole-collecting electrode;
(b) an electron-collecting electrode; and
(c) a photovoltaic layer intermediate the hole-collecting electrode and the electron-collecting electrode, wherein the photovoltaic layer comprises one or more polymers of claim 1.

6. The device of claim 5 further comprising a hole-accepting layer intermediate the photovoltaic layer and the hole-collecting electrode.

7. The device of claim 5 further comprising an electron-accepting layer intermediate the photovoltaic layer and the electron-collecting electrode.

8. A solar cell comprising the device of claim 5.
9. A solar window comprising the device of claim 5.
10. A photodetector comprising the device of claim 5.
11. A field-effect transistor device, comprising:
(a) a gate electrode;
(b) a source electrode;
(c) a drain electrode;
(d) an insulating layer intermediate the gate electrode and the source and drain electrodes; and
(e) an active layer intermediate the insulating layer and the source and drain electrodes, wherein the active layer comprises one or more polymers of claim 1.

12. A field-effect transistor device, comprising:
(a) a gate electrode;
(b) a source electrode;
(c) a drain electrode;
(d) an insulating layer intermediate the gate electrode and the source and drain electrodes; and
(e) an active layer intermediate the source and drain electrodes, wherein the active layer comprises one or more polymers of claim 1.

13. A photodetector comprising the device of claim 11.

14. A polymer comprising repeating units having the structure:

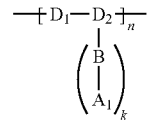

wherein
$D_1$ is a first donor segment;
$D_2$ is a second donor segment;
$A_1$ is an acceptor segment;
B is a π-bridge moiety that conjugates $D_2$ to $A_1$, wherein B at each occurrence is selected from the group consisting of substituted or unsubstituted phenylenevinylene thienylenevinylene, substituted or unsubstituted thienylenevinylene, substituted tetraene, substituted or unsubstituted bithiophene, and substituted or unsubstituted tetrathiophene;
k is 1 or 2; and
n is an integer from 2 to 2000.

15. The polymer of claim 14, wherein $D_1$ at each occurrence is selected from the group consisting of substituted or unsubstituted triphenylamine, substituted or unsubstituted fluorene, substituted or unsubstituted indenofluorene, substituted or unsubstituted cyclopentadithiophene, substituted or unsubstituted 2,2'-fluorenebisthiophene, substituted or unsubstituted carbazole, substituted or unsubstituted indolocarbazole, substituted or unsubstituted silafluorene, substituted or unsubstituted silolodithiophene, substituted or unsubstituted dithienopyrrole, and substituted or unsubstituted benzobisthiophene.

16. The polymer of claim 14, wherein $A_1$, $A_2$, and $A_3$ at each occurrence are independently selected from the group consisting of malononitrile, cyano-(3-cyano-4,5,5-trimethyl-5H-furan-2-ylidene)-acetic acid ethyl ester, 2-(3-cyano-4,5,5-trimethyl-5H-furan-2-ylidene)-malononitrile, 1,3-diethyl-2-thioxo-dihydro-pyrimidine-4,6-dione, 2-ethylidene-malononitrile, 1,3-diethyl-5-ethylidene-pyrimidine-2,4,6-trione, 2-(3-cyano-5,5-dimethyl-4-propenyl-5-furan-2-ylidene)-malononitrile, 5-ethylidene-1,3-diphenyl-2-thioxo-dihydro-pyrimidine-4,6-dione, 2-(2-ethylidene-3-oxo-indan-1-ylidene)-malononitrile, 2-[1-(2,3,5,6-tetrafluoro-pyridin-4-yl)-ethylidene]-malononitrile, and cyano-(3-cyano-4,5,5-trimethyl-5-furan-2-ylidene)-acetic acid ethyl ester.

17. A photovoltaic device, comprising:
(a) a hole-collecting electrode;
(b) an electron-collecting electrode; and
(c) a photovoltaic layer intermediate the hole-collecting electrode and the electron-collecting electrode, wherein the photovoltaic layer comprises one or more polymers of claim 14.

18. The device of claim 17 further comprising a hole-accepting layer intermediate the photovoltaic layer and the hole-collecting electrode.

19. The device of claim 17 further comprising an electron-accepting layer intermediate the photovoltaic layer and the electron-collecting electrode.

20. A solar cell comprising the device of claim 17.
21. A solar window comprising the device of claim 17.

22. A photodetector comprising the device of claim 17.

23. A field-effect transistor device, comprising:
(a) a gate electrode;
(b) a source electrode;
(c) a drain electrode;
(d) an insulating layer intermediate the gate electrode and the source and drain electrodes; and
(e) an active layer intermediate the insulating layer and the source and drain electrodes, wherein the active layer comprises one or more polymers of claim 14.

24. A field-effect transistor device, comprising:
(a) a gate electrode;
(b) a source electrode;
(c) a drain electrode;
(d) an insulating layer intermediate the gate electrode and the source and drain electrodes; and
(e) an active layer intermediate the source and drain electrodes, wherein the active layer comprises one or more polymers of claim 14.

25. A photodetector comprising the device of claim 23.

* * * * *